United States Patent
Ko et al.

(10) Patent No.: US 11,569,470 B2
(45) Date of Patent: Jan. 31, 2023

(54) ORGANIC LIGHT-EMITTING DEVICE AND APPARATUS INCLUDING THE SAME

(71) Applicant: Samsung Display Co., Ltd., Yongin-si (KR)

(72) Inventors: Hyomin Ko, Yongin-si (KR); Changmin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 123 days.

(21) Appl. No.: 16/928,544

(22) Filed: Jul. 14, 2020

(65) Prior Publication Data
US 2021/0183958 A1   Jun. 17, 2021

(30) Foreign Application Priority Data

Dec. 11, 2019  (KR) .................. 10-2019-0164804

(51) Int. Cl.
| | | |
|---|---|---|
| *H01L 51/54* | (2006.01) | |
| *H01L 51/50* | (2006.01) | |
| *H01L 51/52* | (2006.01) | |
| *H01L 51/00* | (2006.01) | |
| *H01L 27/32* | (2006.01) | |

(52) U.S. Cl.
CPC ........ *H01L 51/5056* (2013.01); *H01L 51/006* (2013.01); *H01L 51/5265* (2013.01); *H01L 27/3211* (2013.01); *H01L 51/5016* (2013.01); *H01L 51/5064* (2013.01); *H01L 2251/5392* (2013.01); *H01L 2251/558* (2013.01)

(58) Field of Classification Search
None
See application file for complete search history.

(56) References Cited

U.S. PATENT DOCUMENTS

| | | | | |
|---|---|---|---|---|
| 8,188,315 B2* | 5/2012 | Hwang | ............... | H01L 51/5234 428/917 |
| 8,652,653 B2 | 2/2014 | Lin et al. | | |
| 8,883,324 B2 | 11/2014 | Yabunouchi et al. | | |
| 2012/0001127 A1 | 1/2012 | Brown et al. | | |
| 2015/0318509 A1 | 11/2015 | Song et al. | | |
| 2018/0105741 A1 | 4/2018 | Ko et al. | | |
| 2019/0123291 A1 | 4/2019 | Jeon et al. | | |
| 2019/0148663 A1* | 5/2019 | Lee | .................. | H01L 51/5215 257/40 |
| 2019/0326358 A1 | 10/2019 | Kashiwabara et al. | | |

FOREIGN PATENT DOCUMENTS

| | | |
|---|---|---|
| JP | 2005-516059 A | 6/2005 |
| KR | 10-2007-0091319 A | 9/2007 |
| KR | 10-1157579 B1 | 6/2012 |
| KR | 10-2013-0120855 A | 11/2013 |
| KR | 10-2017-0084393 A | 7/2017 |
| KR | 10-2018-0042513 A | 4/2018 |
| KR | 10-2019-0044148 A | 4/2019 |
| WO | 2010/002848 A1 | 1/2010 |

OTHER PUBLICATIONS

Kruzinauskiene et at Synthetic Metals 2007, 157, 401-406. (Year: 2007).*

* cited by examiner

*Primary Examiner* — Andrew K Bohaty
(74) *Attorney, Agent, or Firm* — Lewis Roca Rothgerber Christie LLP

(57) ABSTRACT

An organic light-emitting device includes: a first pixel electrode on a first emission region, a second pixel electrode on a second emission region, and a third pixel electrode on a third emission region; a counter electrode facing each of the first pixel electrode, the second pixel electrode, and the third pixel electrode; and an interlayer between the counter electrode and each of the first pixel electrode, the second pixel electrode, and the third pixel electrode. The interlayer includes an emission layer, and a hole transport region between the emission layer and each of the first pixel electrode, the second pixel electrode, and the third pixel electrode, the hole transport region includes a planarization layer that includes an amine-based compound represented by Formula 1, Formula 2A, or Formula 2B, and the amine-based compound has a crystallization peak having a noise-to-peak ratio of 1.75 or more in an X-ray diffraction (XRD) spectrum.

20 Claims, 9 Drawing Sheets

ORGANIC LIGHT-EMITTING DEVICE AND APPARATUS INCLUDING THE SAME

CROSS-REFERENCE TO RELATED APPLICATION

This application claims priority to and the benefit of Korean Patent Application Nos. 10-2019-0164804, filed on Dec. 11, 2019, in the Korean Intellectual Property Office, the entire content of which is incorporated herein by reference.

BACKGROUND

1. Field

One or more aspects of embodiments of the present disclosure relate to an organic light-emitting device and an apparatus including the same.

2. Description of Related Art

Organic light-emitting devices are self-emission devices that produce full-color images, and also have wide viewing angles, high contrast ratios, short response times, and excellent characteristics in terms of brightness, driving voltage, and/or response speed, compared to related devices in the art.

The organic light-emitting device may include a first electrode on a substrate, and a hole transport region, an emission layer, an electron transport region, and a second electrode, which are sequentially provided on the first electrode. Holes provided from the first electrode may move toward the emission layer through the hole transport region, and electrons provided from the second electrode may move toward the emission layer through the electron transport region. Carriers, such as holes and electrons, may then recombine in the emission layer to produce excitons. These excitons transition from an excited state to a ground state, thereby generating light.

FIG. 1 is a cross-sectional view showing a part of an organic light-emitting device according to the related art. As shown in FIG. 1, when an anode of the organic light-emitting device is deposited, foreign metal particles may be attached to the surface of the anode. In the process of depositing an interlayer, when an interlayer is deposited according to the shape of the metal particles attached to the surface of the anode, a sharp height difference may be produced, and accordingly, a portion where the interlayer is formed to a small thickness (e.g., a thin thickness) on side surfaces of the metal particles may become a vulnerable point to the electric field. When a cathode is then deposited on an upper surface of the interlayer, diffusion of a cathode material may easily occur at (or through) the vulnerable point, causing a short circuit between the anode and the cathode. Accordingly, defects such as dark spots may be generated, resulting in a fatal (or detrimental) effect on a product yield and device reliability.

SUMMARY

One or more aspects of embodiments of the present disclosure are directed toward solving the above-mentioned problems of the related art, and one or more embodiments include an organic light-emitting device and an apparatus including the same, wherein the organic light-emitting device is able to prevent or substantially reduce the occurrence of a vulnerable point to the electric field, which is caused by metal particles attached to an electrode of the organic light-emitting device.

Additional aspects will be set forth in part in the description which follows and, in part, will be apparent from the description, or may be learned by practice of the presented embodiments of the disclosure.

An embodiment of the present disclosure provides an organic light-emitting device including a first pixel electrode on a first emission region, a second pixel electrode on a second emission region, and a third pixel electrode on a third emission region; a counter electrode facing the first pixel electrode, the second pixel electrode, and the third pixel electrode; and an interlayer between the counter electrode and the first pixel electrode, the second pixel electrode, and the third pixel electrode, wherein the interlayer includes an emission layer, and a hole transport region between the emission layer and the first pixel electrode, the second pixel electrode, and the third pixel electrode, the emission layer includes a first emission layer that is arranged to correspond to the first emission region and to emit a first color light, a second emission layer that is arranged to correspond to the second emission region, or to all of the first emission region, the second emission region, and the third emission region, and to emit a second color light, and a third emission layer that is arranged to correspond to the third emission region and to emit a third color light, wherein each of a maximum emission wavelength of the first color light and a maximum emission wavelength of the second color light is longer than a maximum emission wavelength of the third color light, the first color light and the second color light are emitted as a first order resonance mode, and the third color light is emitted as a first order resonance mode or a second order resonance mode, and the hole transport region includes a planarization layer, wherein the planarization layer includes an amine-based compound represented by Formula 1, 2A, or 2B, and the amine-based compound has a crystallization peak having a noise-to-peak ratio of 1.75 or more in an X-ray diffraction (XRD) spectrum:

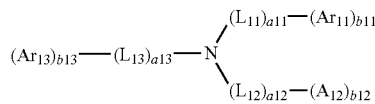

Formula 1

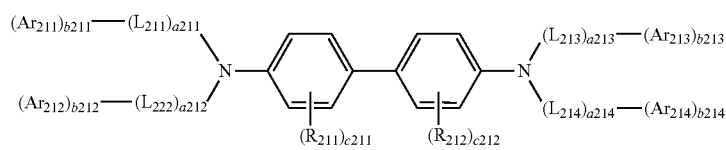

Formula 2A

-continued

Formula 2B

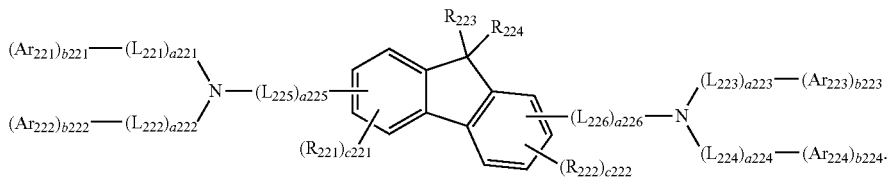

In Formulae 1, 2A, and 2B, $L_{11}$ to $L_{13}$, $L_{211}$ to $L_{214}$, and $L_{221}$ to $L_{226}$ may each independently be a substituted or unsubstituted $C_5$-$C_{60}$ carbocyclic group or a substituted or unsubstituted $C_1$-$C_{60}$ heterocyclic group, a11 to a13, a211 to a214, and a221 to a226 may each independently be an integer from 0 to 3, $Ar_{11}$, $Ar_{12}$, $Ar_{211}$, and $Ar_{213}$ may each independently be selected from a substituted or unsubstituted fluorenyl group, a substituted or unsubstituted biphenyl group, and a substituted or unsubstituted naphthyl group, $Ar_{13}$, $Ar_{212}$, and $Ar_{214}$ may each independently be selected from a substituted or unsubstituted 9,9'-bifluorenyl group and a substituted or unsubstituted thiophenyl group, $Ar_{221}$ to $Ar_{224}$ may each independently be a substituted or unsubstituted $C_5$-$C_{60}$ carbocyclic group or a substituted or unsubstituted $C_1$-$C_{60}$ heterocyclic group, b11 to b13, b211 to b214, and b221 to b224 may each independently be an integer from 1 to 3, $R_{211}$, $R_{212}$, $R_{221}$, and $R_{222}$ may each independently be selected from hydrogen, deuterium, —F, —Cl, —Br, —I, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —S(=O)$_2$($Q_1$), and —P(=O)($Q_1$)($Q_2$), $R_{223}$ and $R_{224}$ may each independently be a substituted or unsubstituted $C_6$-$C_{60}$ alkyl group, c211 and c212 may each independently be an integer from 1 to 4, c221 and c222 may each independently be an integer from 1 to 3, at least one substituent of the substituted $C_5$-$C_{60}$ carbocyclic group, the substituted $C_1$-$C_{60}$ heterocyclic group, the substituted fluorenyl group, the substituted biphenyl group, the substituted naphthyl group, the substituted 9,9'-bifluorenyl group, the substituted thiophenyl group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$), and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), $Q_1$ to $Q_3$, $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amino group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

In one embodiment, at least one of the first pixel electrode, the second pixel electrode, or the third pixel electrode may include, on a surface thereof, a plurality of metal particles, and the planarization layer may surround side surfaces of (e.g., each of) the plurality of metal particles and at least partially expose upper regions of (e.g., each of) the plurality of metal particles, and may be in direct contact with the first pixel electrode, the second pixel electrode, and the third pixel electrode.

In one embodiment, the first pixel electrode, the second pixel electrode, and the third pixel electrode may each independently include, on surfaces thereof, a plurality of metal particles, and the planarization layer may include a first region surrounding side surfaces of (e.g., each of) the plurality of metal particles and at least partially exposing upper regions of (e.g., each of) the plurality of metal particles, and a second region that is horizontally adjacent to the first region and is on surfaces of (e.g., each of) the first pixel electrode, the second pixel electrode, and the third pixel electrode.

In one embodiment, the plurality of metal particles may include silver (Ag) particles.

In one embodiment, the planarization layer may have a thickness in a range of about 250 Å to about 350 Å.

In one embodiment, the counter electrode may include a first counter electrode region corresponding to the first emission region, a second counter electrode region corresponding to the second emission region, and a third counter electrode corresponding to the third emission region, a first distance ($L_1$) between a surface of the first counter electrode region facing the first pixel electrode and a surface of the first pixel electrode facing the first counter electrode region may correspond to the first order resonance distance of the first color light, a second distance ($L_2$) between a surface of the second counter electrode region facing the second pixel electrode and a surface of the second pixel electrode facing the second counter electrode region may correspond to the first order resonance distance of the second color light, and a third distance ($L_3$) between a surface of the third counter electrode region facing the third pixel electrode and a surface of the third pixel facing the third counter electrode region may correspond to the first order resonance distance or the second order resonance distance of the third color light.

In one embodiment, the third color light may be emitted as a first order resonance mode, $L_1$ may be in a range of about about 1,100 Å to about about 1,300 Å, $L_2$ may be in a range of about about 900 Å to about about 1,100 Å, and $L_3$ may be in a range about about 650 Å to about about 850 Å.

In one embodiment, the third color light may be emitted as a second order resonance mode, $L_1$ may be in a range about 1,100 Å to about 1,300 Å, $L_2$ may be in a range of about 900 Å to about 1,100 Å, and $L_3$ may be in a range of about 1,700 Å to about 1,900 Å.

In one embodiment, the first color light may be red light, the second color light may be green light, and the third color light may be blue light.

In one embodiment, the interlayer may further include at least one selected from a first resonance control layer between the first pixel electrode and the first emission layer, a second resonance control layer between the second pixel electrode and the second emission layer, and a third resonance control layer between the third pixel electrode and the third emission layer.

In one embodiment, the first pixel electrode, the second pixel electrode, and the third pixel electrode may each be an anode, the counter electrode may be a cathode, the anode may be a reflective electrode or a semi-transmissive electrode, and the cathode may be a transmissive electrode.

In one embodiment, the first pixel electrode, the second pixel electrode, and the third pixel electrode may each be an anode, the counter electrode may be a cathode, the anode may be a transmissive electrode, and the cathode may be a reflective electrode or a semi-transmissive electrode.

In one embodiment, the second emission layer may correspond to the first emission region, the second emission region, and the third emission region.

In one embodiment, the second emission layer may include a first portion corresponding to the first emission region, a second portion corresponding to the second emission region, and a third portion corresponding to the third emission region, wherein the first portion may be between the first emission layer and the first pixel electrode, and the third portion may be between the third emission layer and the third pixel electrode.

In one embodiment, the second emission layer may include a first portion corresponding to the first emission region, a second portion corresponding to the second emission region, and a third portion corresponding to the third emission region, wherein the first portion may be between the first emission layer and the counter electrode, and the third portion may be between the third emission layer and the counter electrode.

In one embodiment, the second emission layer may include a first portion corresponding to the first emission region, a second portion corresponding to the second emission region, and a third portion corresponding to the third emission region, wherein the first portion may be between the first emission layer and the first pixel electrode, and the third portion may be between the third emission layer and the counter electrode.

In one embodiment, the second emission layer may include a first portion corresponding to the first emission region, a second portion corresponding to the second emission region, and a third portion corresponding to the third emission region, wherein the first portion may be between the first emission layer and the counter electrode, and the third portion may be between the third emission layer and the third pixel electrode.

In one embodiment, the interlayer may further include an electron transport region between the emission layer and the counter electrode.

Another embodiment of the present disclosure provides an apparatus including a thin-film transistor including a source electrode, a drain electrode, and an activation layer; and the organic light-emitting device, wherein the first pixel electrode, the second pixel electrode, and the third pixel electrode of organic light-emitting device may be electrically connected to one selected from the source electrode and the drain electrode.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
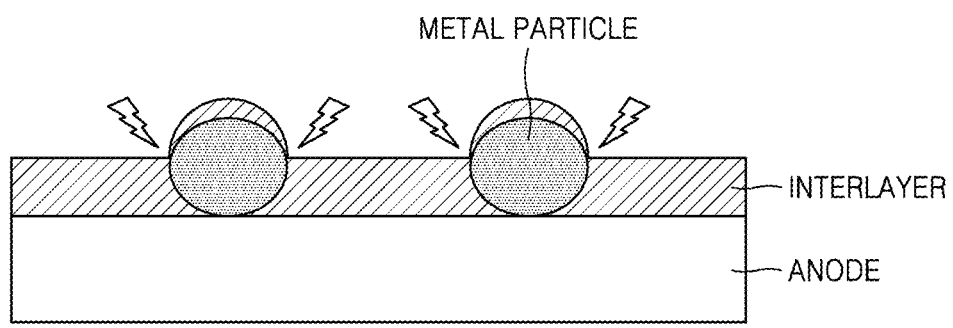
FIG. 1 is a cross-sectional view showing a part of an organic light-emitting device according to related art.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. Expressions such as "one of" and "selected from," when preceding a list of elements, modify the entire list of elements and do not modify the individual elements of the list. Further, the use of "may" when describing embodiments of the present disclosure refers to "one or more embodiments of the present disclosure."

As embodiments allows for various changes and numerous embodiments, example embodiments will be illustrated in the drawings and described in more detail in the written description. Effects and features of the present disclosure, and methods of achieving the effects and features, will be apparent with reference to embodiments described below in connection with the drawings. However, the present disclosure is not limited to embodiments disclosed below, and may be implemented in various forms.

Hereinafter, embodiments of the present disclosure will be described in more detail with reference to the accompanying drawings. Like reference numerals in the drawings denote like elements, and thus their redundant descriptions will not be provided.

In the following embodiments, terms such as "first," "second," etc., are used to distinguish one component from another rather than having a limited meaning.

In the following embodiments, an expression used in the singular encompasses the expression of the plural, unless it has a clearly different meaning in the context.

In the following embodiments, it is to be understood that the terms such as "including," "having," and "comprising" are intended to indicate the existence of the features or components disclosed in the specification, but are not intended to preclude the possibility that one or more other features or components may be added.

In the present embodiments, it will be understood that when a layer, film, region, or plate is referred to as being "on" or "formed on" another layer, region, or component, it can be directly formed on the other layer, film, region, or plate(without any intervening elements therebetween), or indirectly formed on the other layer, film, region, or plate (that is, for example, intervening layers, films, regions, or plates may be present).

Sizes of components in the drawings may be exaggerated for convenience of explanation. In other words, because sizes and thicknesses of components in the drawings are arbitrarily illustrated for convenience of explanation, the following embodiments are not limited thereto.

FIGS. 2A to 2E are each a cross-sectional view of an organic light-emitting device according to an embodiment of the present disclosure.

Figure 2A:
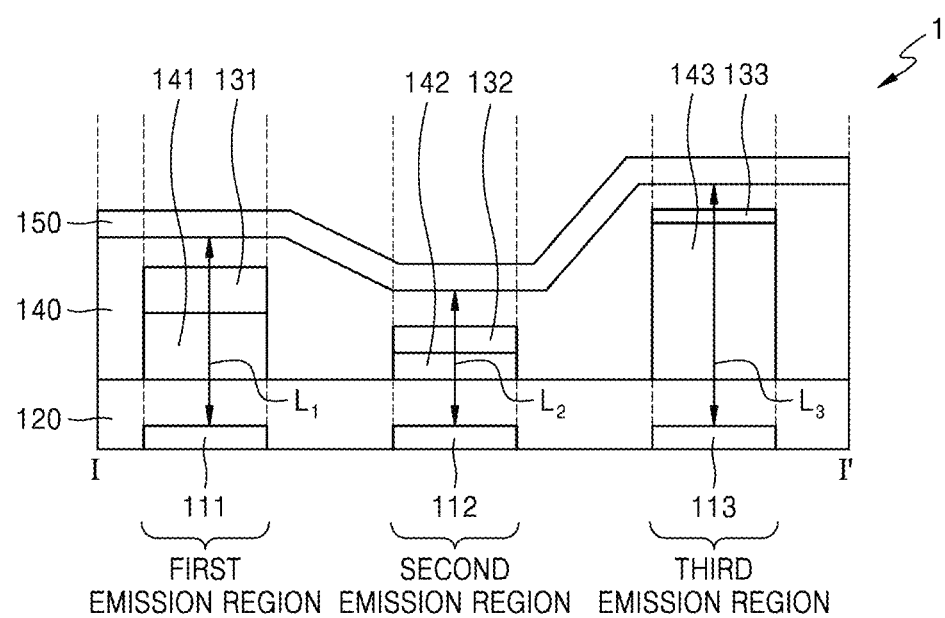
FIGS. 2A to 2E are each a cross-sectional view of an organic light-emitting device according to an embodiment of the present disclosure.
Figure 2B:
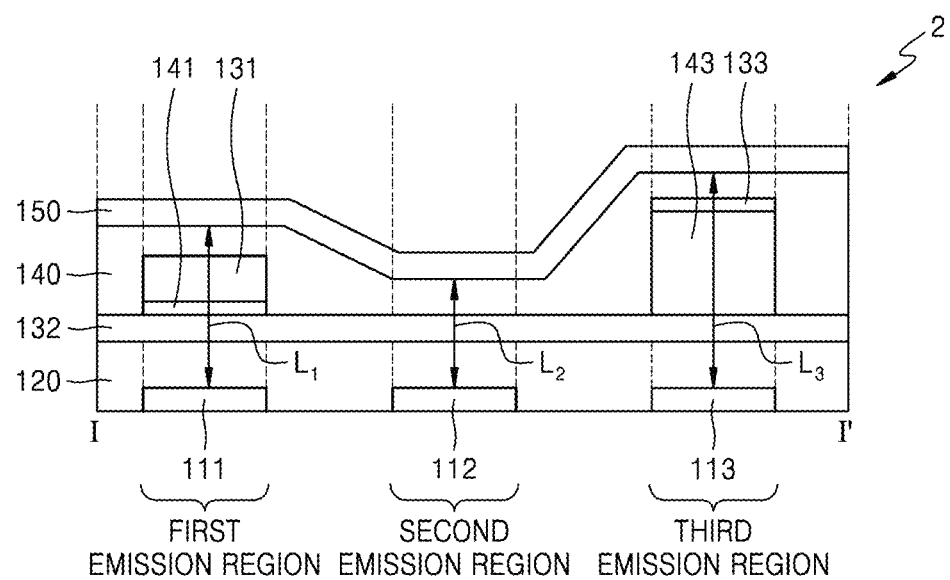
Figure 2C:
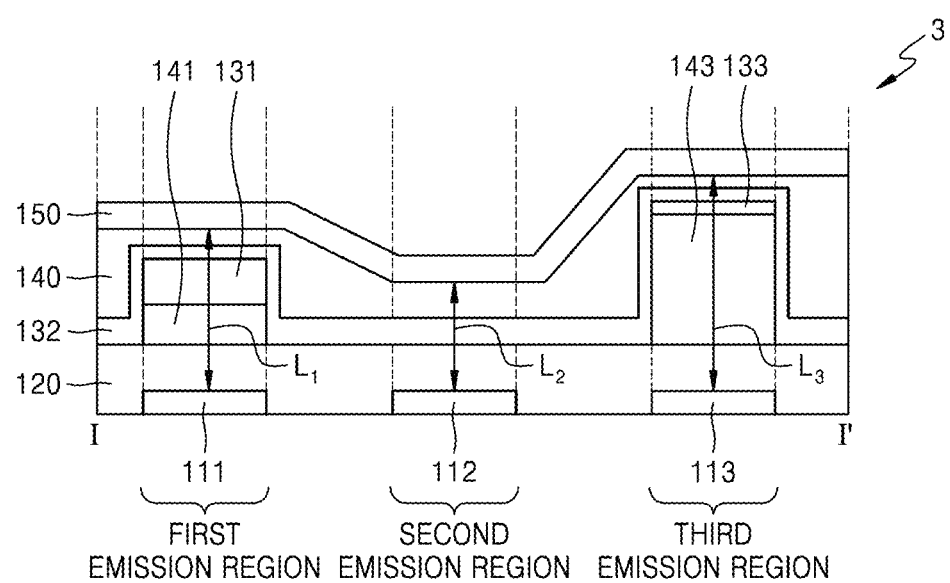
Figure 2D:
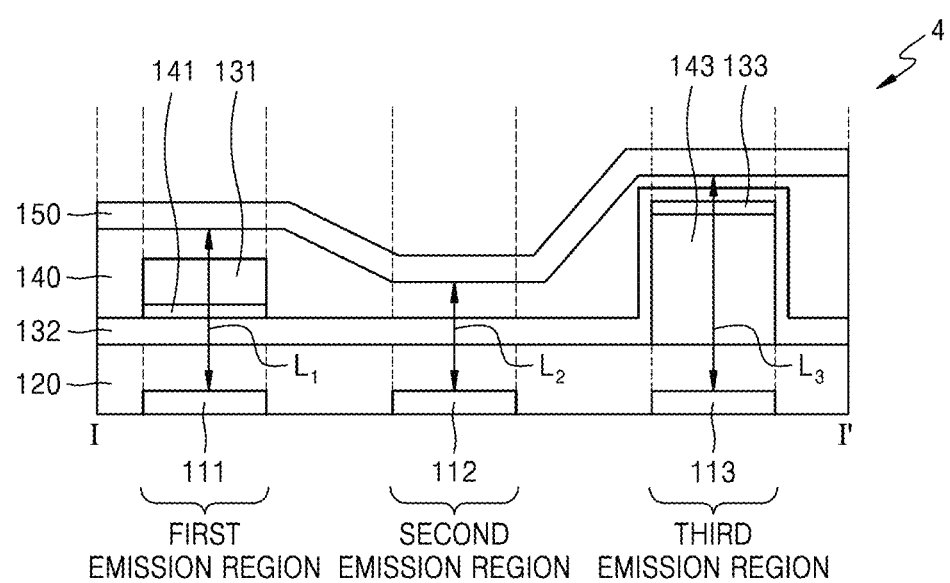
Figure 2E:
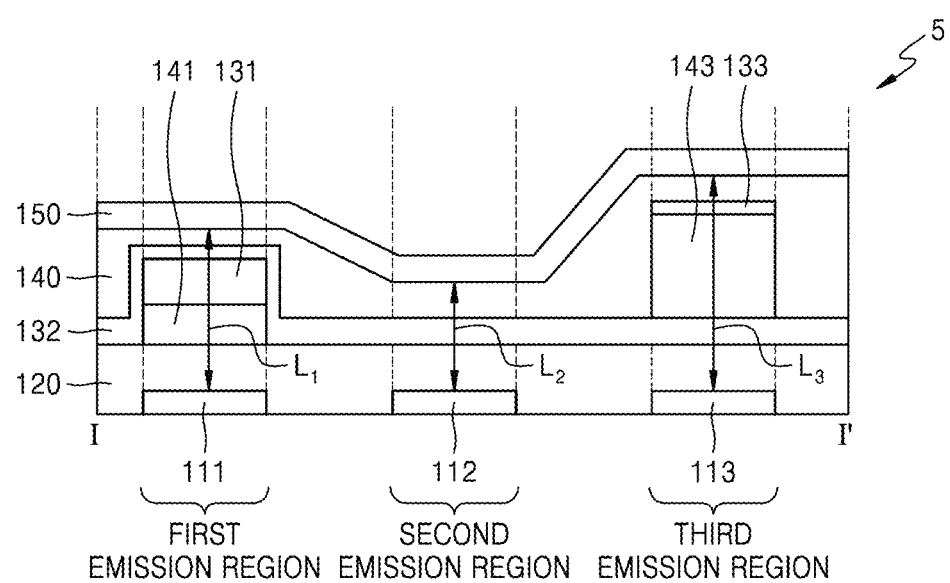

Description of FIG. 2A

Referring to FIG. 2A, the structure of an organic light-emitting device 1 according to an embodiment will be described in more detail.

The organic light-emitting device 1 includes a first pixel electrode 111, a second pixel electrode 112, and a third pixel electrode 113, each on a first emission region, a second emission region, and a third emission region, respectively.

Each of the first pixel electrode 111, the second pixel electrode 112, and the third pixel electrode 113 may be formed as a transmissive electrode, a semi-transmissive electrode, or a reflective electrode.

When the first pixel electrode 111, the second pixel electrode 112, and the third pixel electrode 113 are each a transmissive electrode, the first pixel electrode 111, the second pixel electrode 112, and the third pixel electrode 113 may each include a transparent conductive layer including indium tin oxide (ITO), indium zinc oxide (IZO), tin oxide ($SnO_2$), zinc oxide (ZnO), indium oxide ($In_2O_3$), indium gallium oxide (IGO), or any combination thereof.

In one embodiment, the first pixel electrode 111, the second pixel electrode 112, and the third pixel electrode 113 may each further include, in addition to the transparent conductive layer, a semi-transmissive thin film having a thickness of several to tens nanometers and formed of silver (Ag), magnesium (Mg), aluminum (Al), platinum (Pt), palladium (Pd), gold (Au), indium (In), nickel(Ni), neodymium (Nd), iridium (Ir), chromium (Cr), lithium (Li), calcium (Ca), ytterbium (Yb), or any combination thereof, to improve light efficiency.

When the first pixel electrode 111, the second pixel electrode 112, and the third pixel electrode 113 are each a reflective electrode, the first pixel electrode 111, the second pixel electrode 112, and the third pixel electrode 113 may each include a reflective film, which is formed of Ag, Mg, Al, Pt, Pd, Au, Ni, In, Nd, Ir, Cr, Li, Ca, Yb, or any combination thereof, and a transparent conductive layer on an upper portion and/or a lower portion of the reflective film.

The first pixel electrode 111, the second pixel electrode 112, and the third pixel electrode 113 may be formed of one or more suitable materials other than the above-described materials, and may each independently have a single-layered structure including a single layer or a multi-layered structure including a plurality of layers.

For example, the first pixel electrode 111, the second pixel electrode 112, and the third pixel electrode 113 may have a three-layered structure of ITO/Ag/ITO, but embodiments of the present disclosure are not limited thereto.

The first pixel electrode 111, the second pixel electrode 112, and the third pixel electrode 113 may each independently be on a substrate.

The substrate may be a glass substrate and/or a plastic substrate, each having excellent mechanical strength, thermal stability, transparency, surface smoothness, ease of handling, and/or water resistance. For example, the substrate may include polyethersulphone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), and/or cellulose acetate propionate (CAP).

For example, in the case of a bottom emission device, in which light of emission layer 131, 132, and 133 is emitted in the direction toward the substrate, the substrate may be transparent.

In one embodiment, in the case of a top emission device, in which light of the emission layer 131, 132, and 133 is emitted in the direction opposite to the substrate, the substrate does not essentially need to be transparent, and may be opaque or translucent.

in some embodiments, a buffer layer, a thin-film transistor, an organic insulating layer, and/or the like may be further included between the substrate and the first pixel electrode 111, the second pixel electrode 112, and/or the third pixel electrode 113.

The organic light-emitting device 1 may include a counter electrode 150 facing the first pixel electrode 111, the second pixel electrode 112, and the third pixel electrode 113.

The counter electrode 150 may include a first counter electrode region corresponding to the first emission region, a second counter electrode region corresponding to the second emission region, and a third counter electrode region corresponding to the third emission region.

The counter electrode 150 may be a transmissive electrode, a semi-transmissive electrode, or a reflective electrode.

The counter electrode 150 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), silver-magnesium (Ag—Mg), ITO, and IZO, but embodiments of the present disclosure are not limited thereto.

The counter electrode 150 may be formed of one or more suitable materials other than the above-described materials, and may have a single-layered structure including a single layer or a multi-layered structure including a plurality of layers.

In one embodiment, the first pixel electrode 111, the second pixel electrode 112, and the third pixel electrode 113 may each be an anode, and the counter electrode 150 may be a cathode. The anode may be a reflective electrode or a semi-transmissive electrode, and the cathode may be a transmissive electrode.

In one or more embodiments, the first pixel electrode 111, the second pixel electrode 112, and the third pixel electrode 113 may each be an anode, and the counter electrode 150 may be a cathode. The anode may be a transmissive electrode, and the cathode may be a reflective electrode or a semi-transmissive electrode.

The organic light-emitting device 1 may include an interlayer between the counter electrode 150 and the first pixel electrode 111, the second pixel electrode 112, and the third pixel electrode 113.

The interlayer may include emission layers 131, 132, and 133, and a hole transport region 120 between the emission layers 131, 132, and 133 and the first pixel electrode 111, the second pixel electrode 112, and the third pixel electrode 113.

The emission layers 131, 132, and 133 may include: a first emission layer 131 to correspond to the first emission region and to emit first color light; a second emission layer 132 to correspond to the second emission region, or to the entirety of the first emission region, the second emission region, and the third emission region, and to emit second color light; and a third emission layer 133 to correspond to the third emission region and to emit third color light.

FIG. 2A illustrates that the second emission layer 132 is provided to correspond to the second emission region.

Each of the maximum emission wavelength of the first color light and the maximum emission wavelength of the second color light may be longer than the maximum emission wavelength of the third color light.

For example, the first color light may be red light, the second color light may be green light, and the third color light may be blue light, but embodiments of the present disclosure are not limited thereto.

For example, the maximum emission wavelength of the first color light may be in a range of about 620 nm to about 750 nm; the maximum emission wavelength of the second color light may be in a range of about 495 nm to about 570 nm; and the maximum emission wavelength of the third color light may be in a range of about 450 nm to about 495 nm, but embodiments of the present disclosure are not limited thereto.

The first color light and the second color light may each be emitted as a first order resonance mode, and the third color light may be emitted as a first order resonance mode or a second order resonance mode.

In order to emit light generated in the emission layer to the outside effectively (or suitably), a fine resonance structure may be applied to the organic light emitting device. For example, when light repeats reflection between a counter electrode 150, which is a reflective electrode, and a pixel electrode 111, 112, or 113, which is a semi-transmissive electrode, wherein the counter electrode 150 and the pixel electrode 111, 112, or 113 are spaced apart by an optical length, light with a specific wavelength may be amplified due to the constructive interference, and light with other wavelengths may be cancelled. The amplified light may be emitted to the outside through the pixel electrode 111, 112, or 113, which is a semi-transmissive electrode.

Each of the first emission region, the second emission region, and the third emission region may include a pixel electrode 111, 112, and 113, respectively, a hole transport region 120, an emission layer 131, 132, and 133, respectively, an electron transport region 140, and a counter electrode 150. A distance between a front surface (i.e., a surface facing the counter electrode 150) of each of the pixel electrodes 111, 112, and 113 included in the first emission region, the second emission region, and the third emission region and a bottom surface (i.e., a surface in a direction facing the pixel electrodes 111, 112, and 113) of the counter electrode 150 is defined as a resonance distance (Lc), and the Lc can be calculated using Equation 1 below:

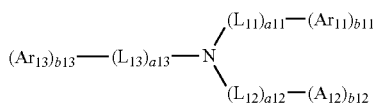

Equation 1

In Equation 1, Nc represents an effective refractive index of a resonance structure, λ represents a wavelength of light to be resonated, and k represents a resonance order. The resonance structure may include all of organic layers between the counter electrode 150 and the pixel electrodes 111, 112, and 113.

A first order resonance structure is a structure in which the resonance distance corresponds to a first order resonance distance of the wavelength of light emitted from the organic light-emitting device, and in such case, k in Equation 1 is 1. A second order resonance structure is a structure in which the resonance distance corresponds to a second order resonance distance of the wavelength of light emitted from the organic light-emitting device, and in such case, k in Equation 1 is 2.

Figure 3:
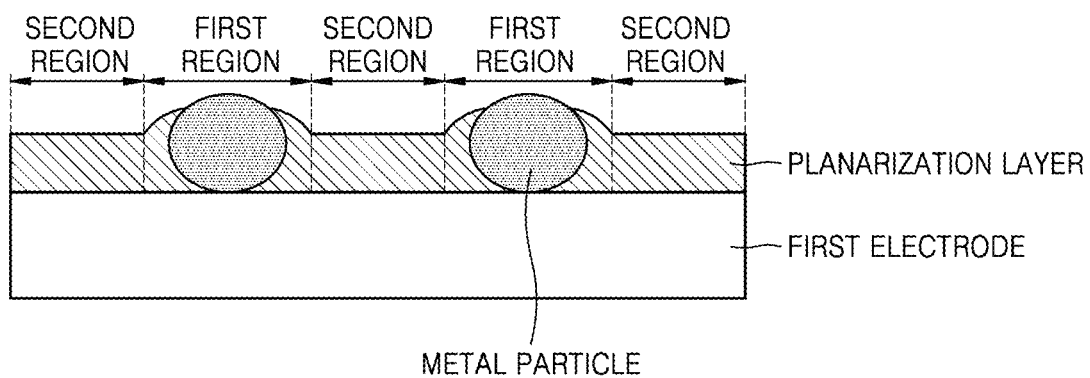
FIG. 3 is a cross-sectional view showing a part of an organic light-emitting device according to an embodiment of the present disclosure.

Because each of the first color light and the second color light is emitted as a first order resonance mode, and the third color light is emitted as a first or second order resonance mode, the interlayer may become thinner. Thus, an amount of materials used for the interlayer may be reduced. Accordingly, the manufacturing cost of the organic light-emitting device 1 may be also reduced. In addition, as the thickness of the interlayer becomes small, the organic light-emitting device 1 may have reduced driving voltage and increased current efficiency.

according to an embodiment of the present disclosure. As shown in FIG. 3, the planarization layer includes a first region and a second region, wherein the first region is on a side surface of the metal particle, while at least partially exposing an upper region of the metal particle, and the second region is horizontally adjacent to the first region and is on surfaces of the first pixel electrode, the second pixel electrode, and the third pixel electrode.

The first region may refer to a region of the planarization layer that surrounds a side surface of the metal particle while at least partially exposing the upper region of the metal particle.

In one embodiment, the first region may have a curved surface (e.g., a smoothly curved surface).

Because the planarization layer is not formed on at least a portion of the upper region of the metal particle, and is provided to surround side surfaces of the metal particle, a height difference caused (e.g., generated) by the metal particle may be reduced. Furthermore, because a portion in which the interlayer is deposited thinly on side surfaces of the metal particle is not substantially formed, the generation of vulnerable points to the electric field may be prevented or reduced.

The planarization layer may include an amine-based compound represented by Formula 1, Formula 2A, or Formula 2B:

Formula 1

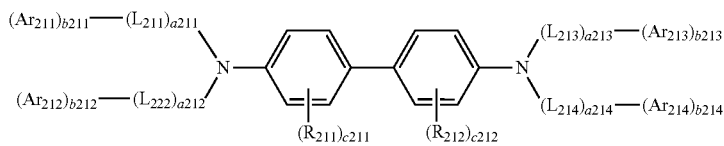

Formula 2A

Formula 2B

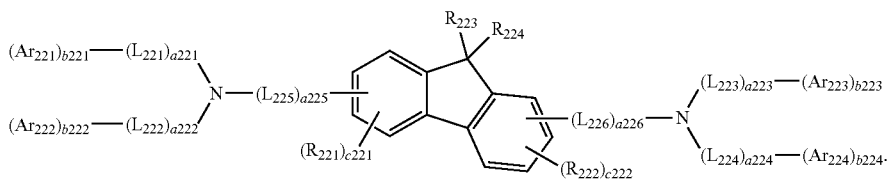

In one embodiment, at least one of the first pixel electrode 111, the second pixel electrode 112, or the third pixel electrode 113 may include a plurality of metal particles on surface(s) thereof. In one embodiment, the plurality of metal particles may include silver (Ag) particles.

In one embodiment, the hole transport region 120 of the organic light-emitting device 1 may include a planarization layer. The planarization layer may surround a side surface of the plurality of metal particles, while an upper surface of the plurality of metal particles may remain at least partially exposed, and the planarization layer may be in direct contact with the first pixel electrode 111, the second pixel electrode 112, and the third pixel electrode 113.

FIG. 3 is a cross-sectional view showing a portion of an organic light-emitting device including a planarization layer In Formulae 1, 2A, and 2B, $L_{11}$ to $L_{13}$, $L_{211}$ to $L_{214}$, and $L_{221}$ to $L_{226}$ may each independently be a substituted or unsubstituted $C_5$-$C_{60}$ carbocyclic group or a substituted or unsubstituted $C_1$-$C_{60}$ heterocyclic group, a11 to a13, a211 to a214, and a221 to a226 may each independently be an integer from 0 to 3, $Ar_{11}$, $Ar_{12}$, $Ar_{211}$, and $Ar_{213}$ may each independently be selected a substituted or unsubstituted fluorenyl group, a substituted or unsubstituted biphenyl group, and a substituted or unsubstituted naphthyl group, $Ar_{13}$, $Ar_{212}$, and $Ar_{214}$ may each independently be selected from a substituted or unsubstituted 9,9'-bifluorenyl group and a substituted or unsubstituted thiophenyl group, Ar$_{221}$ to Ar$_{224}$ may each independently be a substituted or unsubstituted C$_5$-C$_{60}$ carbocyclic group or a substituted or unsubstituted C$_1$-C$_{60}$ heterocyclic group, b11 to b13, b211 to b214, and b221 to b224 may each independently be an integer from 1 to 3, R$_{211}$, R$_{212}$, R$_{221}$, and R$_{222}$ may each independently be selected from hydrogen, deuterium, —F, —Cl, —Br, —I, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted C$_1$-C$_{60}$ heteroaryl group, a substituted or unsubstituted monovalent non-aromatic condensed polycyclic group, a substituted or unsubstituted monovalent non-aromatic condensed heteropolycyclic group, —Si(Q$_1$)(Q$_2$)(Q$_3$), —N(Q$_1$)(Q$_2$), —B(Q$_1$)(Q$_2$), —S(=O)$_2$(Q$_1$), and —P(=O)(Q$_1$)(Q$_2$), R$_{223}$ and R$_{224}$ may each independently be a substituted or unsubstituted C$_6$-C$_{60}$ alkyl group, c211 and c212 may each independently be an integer from 1 to 4, c221 and c222 may each independently be an integer from 1 to 3, at least one substituent of the substituted C$_5$-C$_{60}$ carbocyclic group, the substituted C$_1$-C$_{60}$ heterocyclic group, the substituted fluorenyl group, the substituted biphenyl group, the substituted naphthyl group, the substituted 9,9'-bifluorenyl group, the substituted thiophenyl group, the substituted C$_1$-C$_{60}$ alkyl group, the substituted C$_2$-C$_{60}$ alkenyl group, the substituted C$_2$-C$_{60}$ alkynyl group, the substituted C$_1$-C$_{60}$ alkoxy group, the substituted C$_3$-C$_{10}$ cycloalkyl group, the substituted C$_1$-C$_{10}$ heterocycloalkyl group, the substituted C$_3$-C$_{10}$ cycloalkenyl group, the substituted C$_1$-C$_{10}$ heterocycloalkenyl group, the substituted C$_6$-C$_{60}$ aryl group, the substituted C$_6$-C$_{60}$ aryloxy group, the substituted C$_6$-C$_{60}$ arylthio group, the substituted C$_1$-C$_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amidino group, a hydrazine group, a hydrazone group, a C$_1$-C$_{60}$ alkyl group, a C$_2$-C$_{60}$ alkenyl group, a C$_2$-C$_{60}$ alkynyl group, and a C$_1$-C$_{60}$ alkoxy group;

a C$_1$-C$_{60}$ alkyl group, a C$_2$-C$_{60}$ alkenyl group, a C$_2$-C$_{60}$ alkynyl group, and a C$_1$-C$_{60}$ alkoxy group, each substituted with at least one selected from deuterium, —F, —Cl, —Br, —I, a hydroxyl group, a cyano group, a nitro group, an amidino group, a hydrazine group, a hydrazone group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, a monovalent non-aromatic condensed heteropolycyclic group, —Si(Q$_{11}$)(Q$_{12}$)(Q$_{13}$), —N(Q$_{11}$)(Q$_{12}$), —B(Q$_{11}$)(Q$_{12}$), —C(=O)(Q$_{11}$), —S(=O)$_2$(Q$_{11}$), and —P(=O)(Q$_{11}$)(Q$_{12}$);

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, and a monovalent non-aromatic condensed heteropolycyclic group;

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazine group, a hydrazone group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, a monovalent non-aromatic condensed heteropolycyclic group, —Si(Q$_{21}$)(Q$_{22}$)(Q$_{23}$), —N(Q$_{21}$)(Q$_{22}$), —B(Q$_{21}$)(Q$_{22}$), —C(=O)(Q$_{21}$), —S(=O)$_2$(Q$_{21}$), and —P(=O)(Q$_{21}$)(Q$_{22}$); and —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), and —P(=O)(Q$_{31}$)(Q$_{32}$), wherein Q$_1$ to Q$_3$, Q$_{11}$ to Q$_{13}$, Q$_{21}$ to Q$_{23}$, and Q$_{31}$ to Q$_{33}$ may each independently be selected from hydrogen, deuterium, —F, —Cl, —Br, —I, a hydroxyl group, a cyano group, a nitro group, an amino group, an amidino group, a hydrazine group, a hydrazone group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryl group substituted with a C$_1$-C$_{60}$ alkyl group, a C$_6$-C$_{60}$ aryl group substituted with a C$_6$-C$_{60}$ aryl group, a C$_1$-C$_{60}$ heteroaryl group, a monovalent non-aromatic condensed polycyclic group, a monovalent non-aromatic condensed heteropolycyclic group, a biphenyl group, and a terphenyl group.

In one embodiment, in Formulae 1, 2A, and 2B, a11 to a13, a211 to a214, and a221 to a226 may each be 0.

In one embodiment, in Formulae 1 and 2A, Ar$_{11}$, Ar$_{12}$, Ar$_{211}$, and Ar$_{213}$ may each independently be selected from groups represented by Formulae 3A-1 to Formulae 3A-3, and Ar$_{13}$, Ar$_{212}$, and Ar$_{214}$ may each independently be selected from groups represented by Formulae 3B-1 and 3B-2:

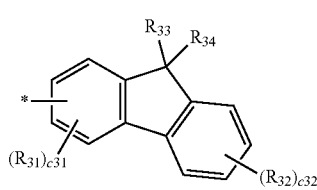

3A-1

-continued

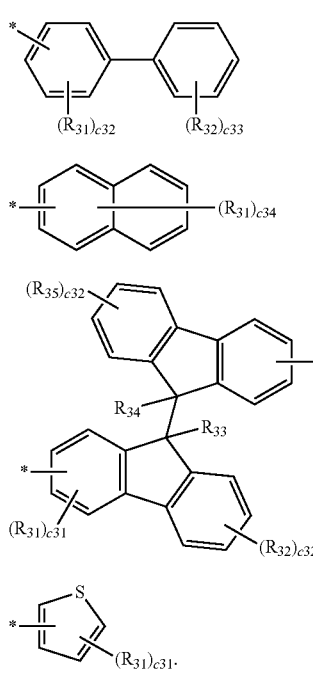

3A-2

3A-3

3B-1

3B-2

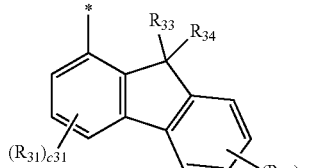

3A-11

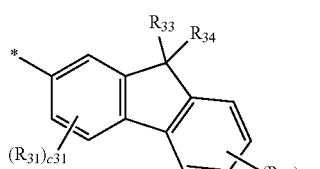

3A-12

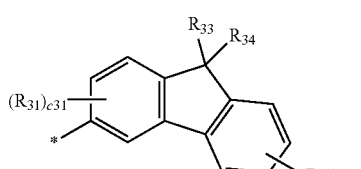

3A-13

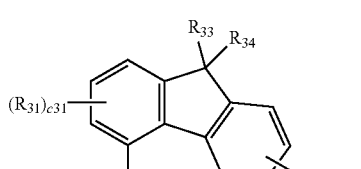

3A-14

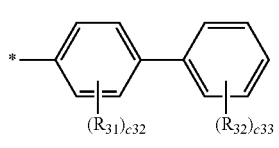

3A-15

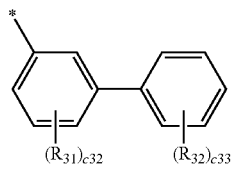

3A-16

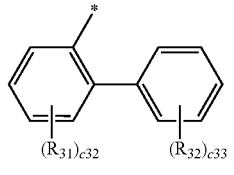

3A-17

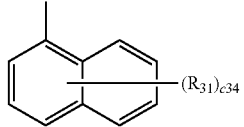

3A-18

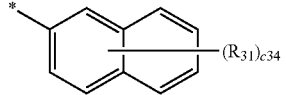

3A-19

In Formulae 3A-1 to 3A-3, 3B-1, and 3B-2, $R_{31}$ to $R_{36}$ may each independently be selected from hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a spiro-fluorene-benzofluorenyl group, a benzofluorenyl group, a dibenzofluorenyl group, a phenalenyl group, a phenanthrenyl group, an anthracenyl group, a fluoranthenyl group, a triphenylenyl group, a pyridinyl group, a pyrazinyl group, a pyrimidinyl group, a quinolinyl group, an isoquinolinyl group, a benzoquinolinyl group, a naphthyridinyl group, a quinoxalinyl group, a quinazolinyl group, a carbazolyl group, a phenanthridinyl group, an acridinyl group, a phenanthrolinyl group, a phenazinyl group, a triazinyl group, a dibenzofuranyl group, a dibenzothiophenyl group, a dibenzosilolyl group, —Si($Q_{31}$)($Q_{32}$)($Q_{33}$), —N($Q_{31}$)($Q_{32}$), and —B($Q_{31}$)($Q_{32}$), c31 may be an integer from 1 to 3,
c32 may be an integer from 1 to 4,
c33 may be an integer from 1 to 5,
c34 may be an integer from 1 to 7, $Q_{31}$ to $Q_{33}$ may each independently be selected from hydrogen, deuterium, a $C_1$-$C_{20}$ alkyl group, a $C_1$-$C_{20}$ alkoxy group, a $C_3$-$C_{10}$ cycloalkyl group, a $C_6$-$C_{20}$ aryl group, a $C_6$-$C_{20}$ aryl group substituted with a $C_1$-$C_{20}$ alkyl group, a $C_6$-$C_{20}$ aryl group substituted with a $C_6$-$C_{20}$ aryl group, a $C_1$-$C_{20}$ heteroaryl group, a monovalent non-aromatic condensed polycyclic group, a monovalent non-aromatic condensed heteropolycyclic group, and a terphenyl group, and

* indicates a binding site to a neighboring atom.

In one embodiment, in Formulae 1 and 2A, $Ar_{11}$, $Ar_{12}$, $Ar_{211}$, and $Ar_{213}$ may each independently be selected from groups represented by Formulae 3A-11 to 3A-19, and $Ar_{13}$, $Ar_{212}$, and $Ar_{214}$ may each independently be selected from groups represented by Formulae 3B-11 to 3B-16:

-continued

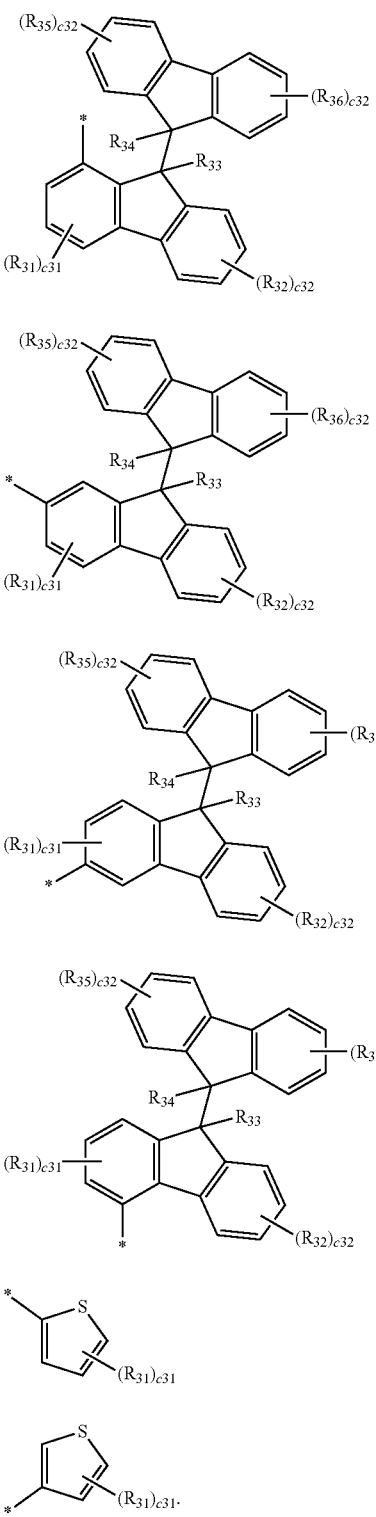

3B-11

3B-12

3B-13

3B-14

3B-15

3B-16

In Formulae 3A-11 to 3A-19, and 3B-11 to 3B-16, $R_{31}$ to $R_{36}$ and c31 to c34 may each be understood by referring to the respective descriptions thereof presented herein, and

* indicates a binding site to a neighboring atom.

In one embodiment, in Formula 2B, $R_{223}$ and $R_{224}$ may each independently be a substituted or unsubstituted $C_6$-$C_{20}$ alkyl group.

In one embodiment, Formula 2B may be represented by Formula 2B-1:

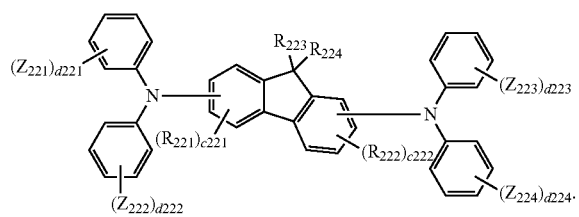

Formula 2B-1

In Formula 2B-1, $R_{221}$ to $R_{224}$, c221, and c222 may each be understood by referring to the respective descriptions thereof presented in connection with Formula 2B, $Z_{221}$ to $Z_{224}$ may each independently be selected from hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a spiro-fluorene-benzofluorenyl group, a benzofluorenyl group, a dibenzofluorenyl group, a phenalenyl group, a phenanthrenyl group, an anthracenyl group, a fluoranthenyl group, a triphenylenyl group, a pyridinyl group, a pyrazinyl group, a pyrimidinyl group, a quinolinyl group, an isoquinolinyl group, a benzoquinolinyl group, a naphthyridinyl group, a quinoxalinyl group, a quinazolinyl group, a carbazolyl group, a phenanthridinyl group, an acridinyl group, a phenanthrolinyl group, a phenazinyl group, a triazinyl group, a dibenzofuranyl group, a dibenzothiophenyl group, a dibenzosilolyl group, —Si($Q_{31}$)($Q_{32}$)($Q_{33}$), —N($Q_{31}$)($Q_{32}$), and —B($Q_{31}$)($Q_{32}$), d221 to d224 may each independently be an integer from 1 to 5, and $Q_{31}$ to $Q_{33}$ may each independently be selected from hydrogen, deuterium, a $C_1$-$C_{20}$ alkyl group, a $C_1$-$C_{20}$ alkoxy group, a $C_3$-$C_{10}$ cycloalkyl group, a $C_6$-$C_{20}$ aryl group, a $C_6$-$C_{20}$ aryl group substituted with a $C_1$-$C_{20}$ alkyl group, a $C_6$-$C_{20}$ aryl group substituted with a $C_6$-$C_{20}$ aryl group, a $C_1$-$C_{20}$ heteroaryl group, a monovalent non-aromatic condensed polycyclic group, a monovalent non-aromatic condensed heteropolycyclic group, and a terphenyl group.

For example, $R_{223}$ and $R_{224}$ in Formula 2B-1 may each independently be a substituted or unsubstituted $C_6$-$C_{20}$ alkyl group.

In one embodiment, the compound represented by Formula 2A or 2B may have a symmetrical structure.

In one embodiment, the amine-based compound may be a compound below, but embodiments of the present disclosure are not limited thereto:

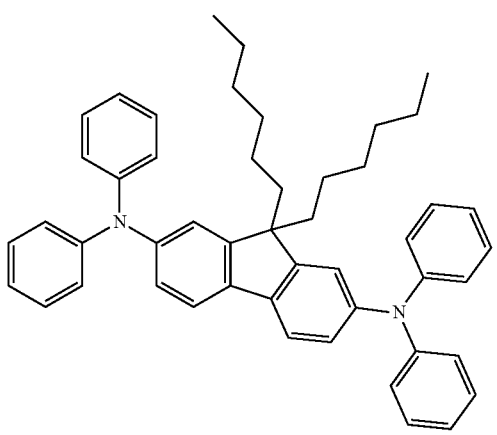

The amine-based compound represented by Formula 1 or Formula 2A may have high crystallinity by including a substituent, which is able to increase the crystallinity, in any of $Ar_{11}$ to $Ar_{13}$ and $Ar_{211}$ to $Ar_{214}$.

The amine-based compound represented by Formula 2B may have high crystallinity by including an alkyl group in which the number of carbon atoms is 6 or more and 60 or less in the $9^{th}$ carbon of fluorene.

The amine-based compound has low affinity with a metal material used for the first pixel electrode 111, the second pixel electrode 112, and the third pixel electrode 113. For example, because in the amine-based compound, there is greater affinity between organic molecules than affinity between an organic molecule and a metal material, the organic molecules of the planarization layer may be deposited on the side surface of the metal particle, rather than being deposited on the upper surface of the metal particle. However, the mechanism in which the amine-based compound is deposited on the side surface of the metal particle is not limited thereto.

The affinity between the amine-based compound and the metal material used for the first pixel electrode 111, the second pixel electrode 112, and the third pixel electrode 113 may be confirmed by, for example, observing the surface morphology with an atomic force microscope (AFM) after depositing an organic film of the amine-based compound on a metal film formed of the metal material. As the intermolecular attraction of the amine-based compound is greater than the affinity between the amine-based compound and the metal material, more self-aggregation patterns of the organic film appear in an AFM image.

Figure 4:
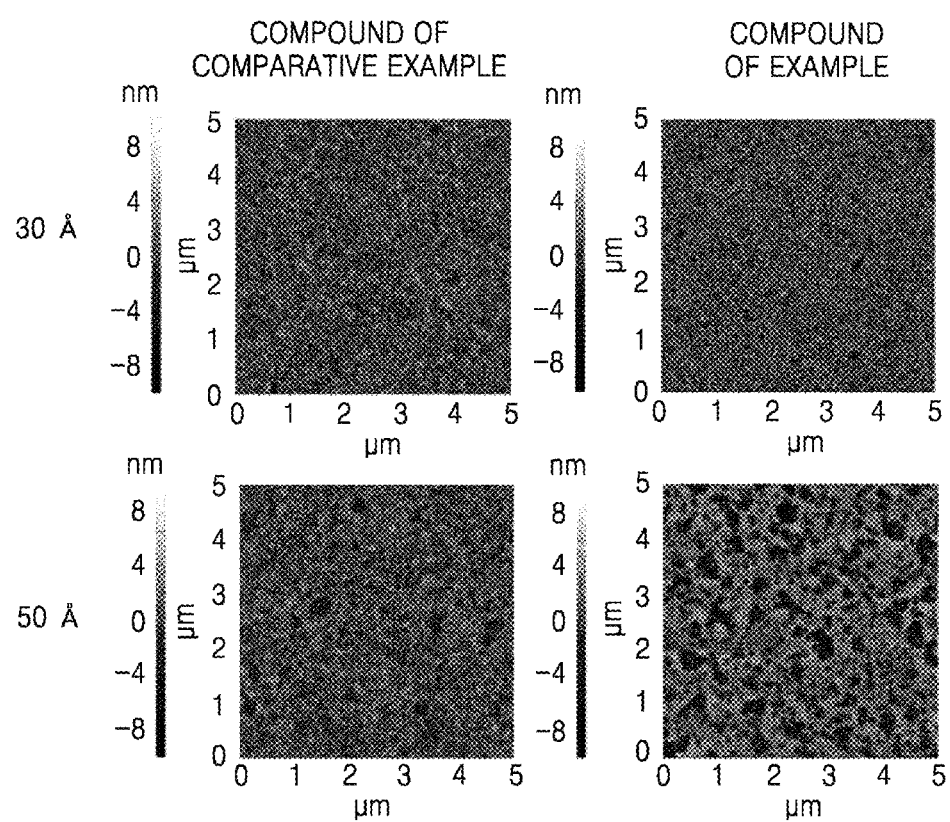
FIG. 4 shows atomic force microscope (AFM) images of organic layers, each prepared by depositing, on a film, a compound of Comparative Example or a compound of Example, to a thickness of 30 Å or to a thickness of 50 Å.

FIG. 4 shows AFM images of organic films prepared by depositing TPAC compound of Comparative Example and HIL-1 compound of Example to a thickness of 30 Å and 50 Å, respectively, on a silver (Ag) film having a thickness of 500 Å. In FIG. 4, it is confirmed that the organic film on which the compound of Example is deposited shows more self-aggregation patterns and greater surface roughness than the organic film on which the compound of Comparative Example is deposited.

The amine-based compound represented by Formulae 1, 2A, or 2B may have a crystallization peak having a noise-to-peak ratio of 1.75 or more in an X-ray diffraction (XRD) spectrum.

The XRD spectrum of the amine-based compound may be measured by depositing the amine-based compound on a metal film having a thickness of 500 Å to a thickness of 300 Å, and then, by scanning in a theta-2theta (θ/2θ) mode. The metal film may be, for example, a silver (Ag) film.

When the amine-based compound represented by Formulae 1, 2A, or 2B has the crystallization peak having the noise-to-peak ratio of 1.75 or more in the XRD spectrum and is used for the planarization layer, the amine-based compound may be deposited on the side surface of the metal particle, rather than being deposited on the upper surface of the metal particle.

Figure 5:
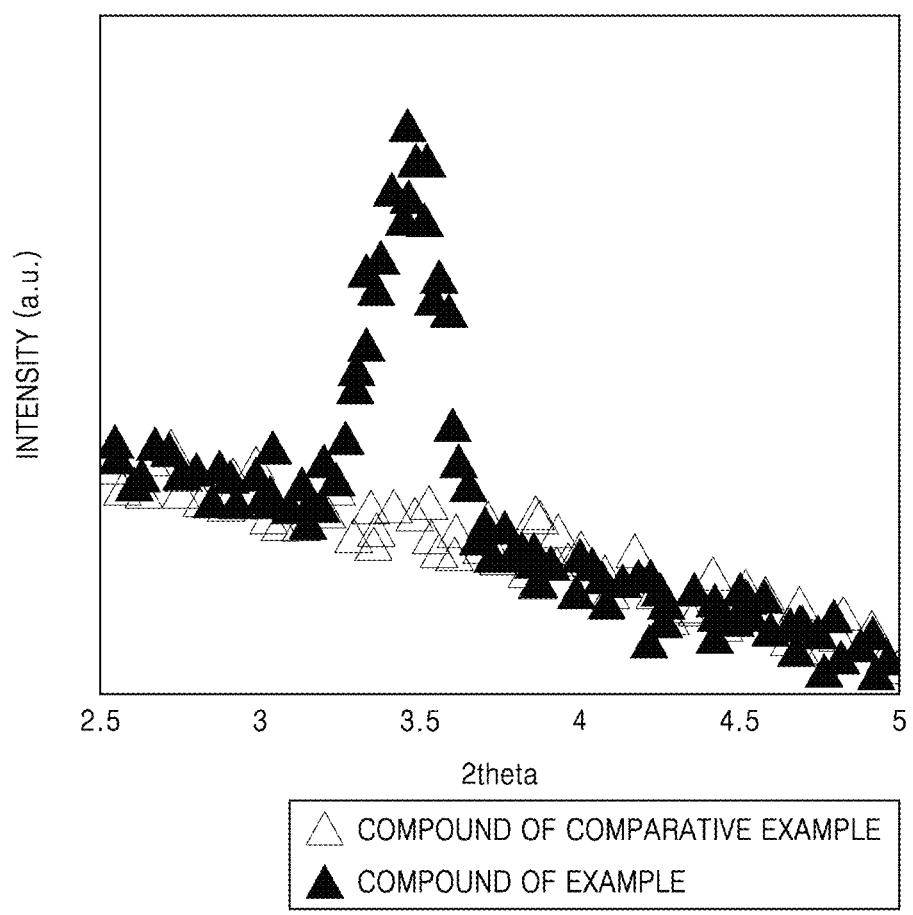
FIG. 5 shows an X-ray diffraction spectroscopy (XRD) spectrum measured in theta-2theta mode after depositing a compound of Comparative Example and an amine-based compound of the present disclosure, each to a thickness of 300 Å, on a silver (Ag) film having a thickness of 500 Å.

FIG. 5 shows a graph where 2θ is in a range of 2.5 to 5 in the XRD spectrum, which is measured in the θ/2θ mode after depositing the compounds of Comparative Example and Example on the Ag film having a thickness of 500 Å to a thickness of 300 Å. In FIG. 5, the compound of Example shows a peak of about 3.5° at 2θ, whereas the compound of Comparative Example does not show a peak. The peak of 3.5° at 2θ appearing in the compound of Example is expected to be a crystallization peak caused by aggregation, but embodiments of the present disclosure are not limited thereto. That is, it is confirmed that, compared to the compound of Comparative Example, the compound of Example has high crystallinity and low affinity with Ag.

In one embodiment, the metal particle may be an Ag particle, but embodiments of the present disclosure are not limited thereto. For example, the first electrode may be an electrode having a three-layered structure of ITO/Ag/ITO, and the metal particle may be an Ag particle, but embodiments of the present disclosure are not limited thereto.

The metal particle may be spherical or ellipsoidal, but embodiments of the present disclosure are not limited thereto, and the metal particle may have any suitable shape.

When the metal particle is spherical, a diameter of the metal particle may be in a range of about 50 nm to about 100 nm. When the metal particle is ellipsoidal, a minor axis of the metal particle may be in a range of about 50 nm to about 100 nm.

Because the planarization layer is formed on the side surface of the metal particle, rather than being formed on the upper surface of the metal particle, the thickness of the planarization layer may be greater than or the same as the maximum vertical length of the metal particle from anode surface. For example, the thickness of the planarization layer may be in a range of about 250 Å to about 350 Å. The thickness of the planarization layer may be a thickness of the second region.

In one embodiment, a first distance $L_1$ between a surface of the first counter electrode region (of the counter electrode 150) facing the first pixel electrode and a surface of the first pixel electrode 111 facing the first counter electrode region may correspond to a first order resonance distance of the first color light, a second distance $L_2$ between a surface of the second counter electrode region facing the second pixel electrode and a surface of the second pixel electrode 112 facing the second counter electrode region may correspond to a first order resonance distance of the second color light, and a third distance $L_3$ between a surface of the third counter electrode region facing the third pixel electrode and a surface of the third pixel electrode 113 facing the third counter electrode region may correspond to a first order resonance distance or a second order resonance distance of the third color light.

In one or more embodiments, $L_1$, $L_2$, and $L_3$ may each satisfy Equations 1 to 3, but embodiments of the present disclosure are not limited thereto.

$$L_1 = \lambda_1 / 2N_1 \qquad \text{Equation 1}$$

$$L_2 = \lambda_2 / 2N_2 \qquad \text{Equation 2}$$

$$L_3 = \lambda_3 / 2N_3 \times n. \qquad \text{Equation 3}$$

In Equations 1 to 3, $L_1$ represents a distance between the first pixel electrode and the counter electrode;

$L_2$ represents a distance between the second pixel electrode and the counter electrode;

$L_3$ represents a distance between the third pixel electrode and the counter electrode;

$\lambda_1$ represents a maximum emission wavelength of the first color light;

$\lambda_2$ represents a maximum emission wavelength of the second color light;

$\lambda_3$ represents a maximum emission wavelength of the third color light;

$N_1$ represents a refractive index of the interlayer between the first pixel electrode and the counter electrode;

$N_2$ represents a refractive index of the interlayer between the second pixel electrode and the counter electrode;

$N_3$ represents a refractive index of the interlayer between the third pixel electrode and the counter electrode; and n is 1 or 2.

In one embodiment, the third color light may be emitted as a first order resonance mode, and in such case, $L_1$ may be in a range of about 1,100 Å to about 1,300 Å, $L_2$ may be in a range of about 900 Å to 1,100 Å, and $L_3$ may be in a range of about 650 Å to about 850 Å.

In one or more embodiments, the third color light may be emitted as a second order resonance mode, and in such case, Li may be in a range of about 1,100 Å to about 1,300 Å, $L_2$ may be in a range of about 900 Å to about 1,100 Å, and $L_3$ may be in a range of about 1,700 Å to about 1,900 Å.

Hereinafter, each layer included in the interlayer of the organic light-emitting device 1 will be described in more detail.

The hole transport region 120 may have i) a single-layered structure including a single layer including a single material, ii) a single-layered structure including a single layer including a plurality of different materials, or iii) a multi-layered structure having a plurality of layers including a plurality of different materials.

The hole transport region 120 may include at least one layer selected from a hole injection layer, a hole transport layer, an emission auxiliary layer, and an electron blocking layer.

The hole transport region 120 may include a planarization layer that is in direct contact with a first pixel electrode 111, a second pixel electrode 112, and a third pixel electrode 113. The planarization layer may be a hole injection layer or a hole transport layer.

For example, the hole transport region 120 may have a single-layered structure including a single layer including a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein for each structure, constituting layers are sequentially stacked from the first pixel electrode 111, the second pixel electrode 112, and the third pixel electrode 113 in this stated order, but embodiments of the present disclosure are not limited thereto.

The hole transport region 120 may include at least one selected from m-MTDATA, TDATA, 2-TNATA, NPB (NPD), p-NPB, TPD, spiro-TPD, spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly (4-styrenesulfonate) (PEDOT/PSS), polyaniline/camphor sulfonic acid (PANI/CSA), and polyaniline/poly(4-styrenesulfonate) (PANI/PSS):

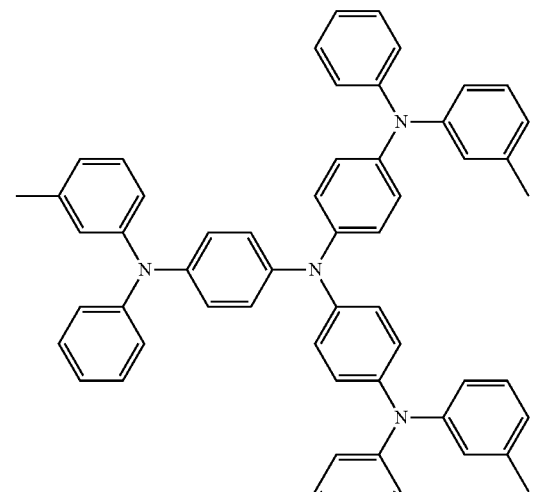

m-MTDATA

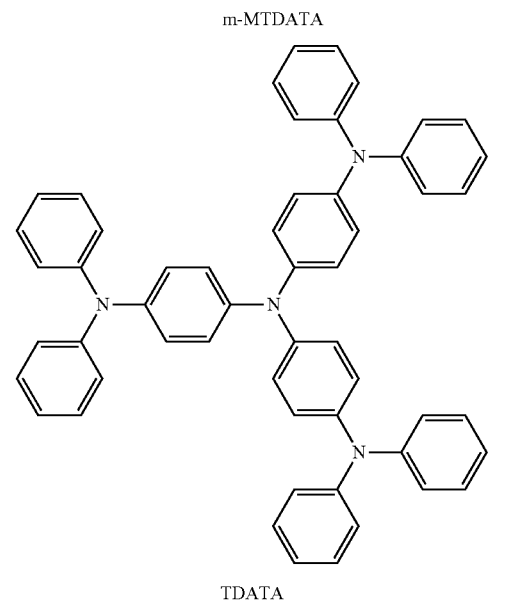

TDATA

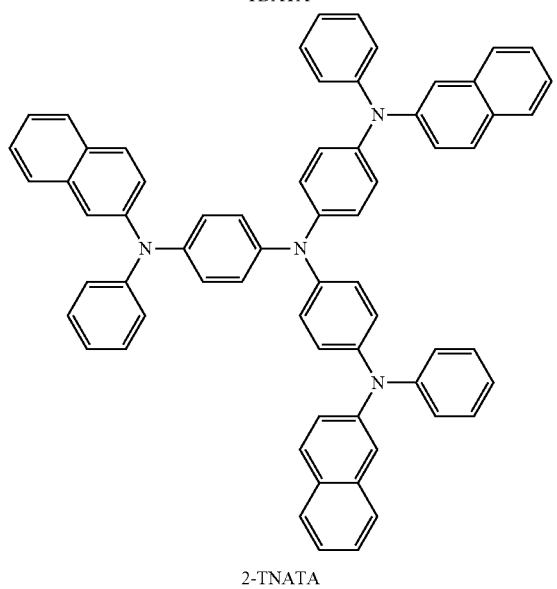

2-TNATA

-continued

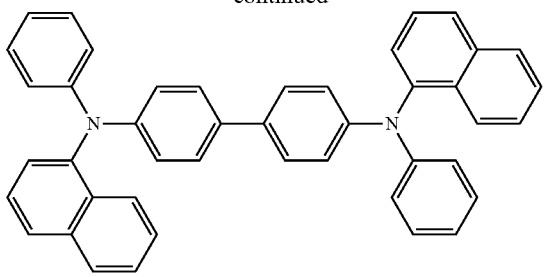

NPB

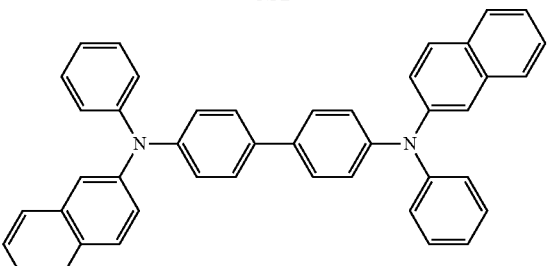

β-NPB

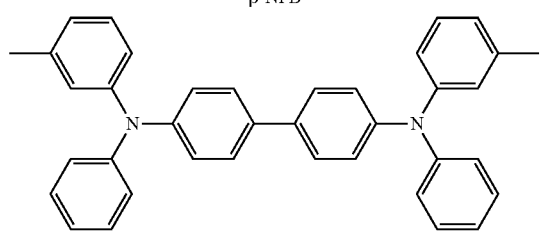

TPD

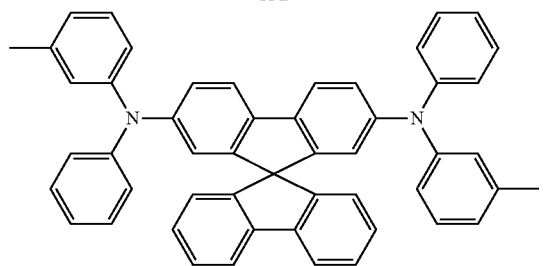

Spiro-TPD

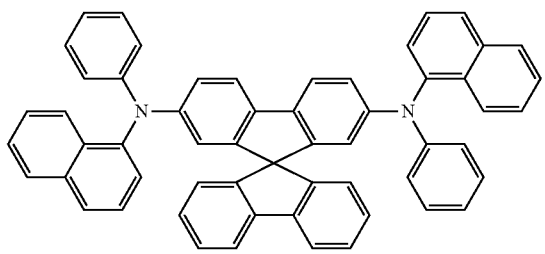

Spiro-NPB

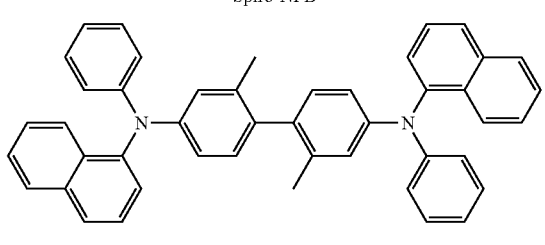

methylated NPB

-continued

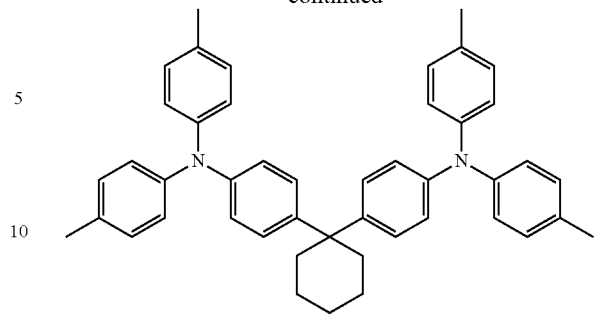

TAPC

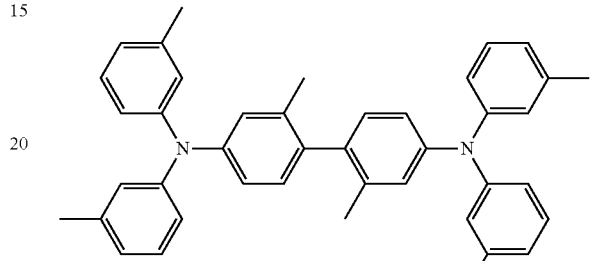

HMTPD

In one embodiment, the interlayer may further include a first resonance control layer 141 between the first pixel electrode 111 and the first emission layer 131, a second resonance control layer 142 between the second pixel electrode 112 and the second emission layer 132, and/or a third resonance control layer 143 between the third pixel electrode 113 and the third emission layer 133.

In one embodiment, the organic light-emitting device may have a structure in which each of the first emission region and the second emission region has a first order resonance structure, and the third emission region has a first order resonance structure or a second order resonance structure, thereby reducing the manufacturing cost. For example, when each of the first emission region to the third emission region has a first order resonance structure, the resonance control layers 141, 142, and/or 143 may have a small thickness. Accordingly, use of a material for the resonance control layers 141, 142, and/or 143 may be saved (reduced).

Each of the first resonance control layer 141, the second resonance control layer 142, and the third resonance control layer 143 may have i) a single-layered structure including a single layer including a single material, ii) a single-layered structure including a single layer including a plurality of different materials, or iii) a multi-layered structure having a plurality of layers including a plurality of different materials.

Each of the first resonance control layer 141, the second resonance control layer 142, and the third resonance control layer 143 may include any of the above-described hole transport materials for the hole transport region 120.

Each of the first resonance control layer 141, the second resonance control layer 142, and the third resonance control layer 143 may be provided to appropriately (or suitably) control $L_1$, $L_2$, and $L_3$, respectively.

The emission layer 131, 132, and 133 may each include a host and a dopant. The dopant may include at least one selected from a phosphorescent dopant and a fluorescent dopant.

An amount of the dopant in each of the emission layers 131, 132, and 133 may be in a range of about 0.01 parts by weight to about 15 parts by weight based on 100 parts by weight of the host, but embodiments of the present disclosure are not limited thereto.

A thickness of the emission layers 131, 132, and 133 may each independently be in a range of about 100 Å to about 1,000 Å, for example, about 200 Å to about 600 Å. When the thicknesses of the emission layers 131, 132, and 133 are within any of the ranges above, excellent (or suitable) light-emitting characteristics may be obtained without a substantial increase in driving voltage.

The host may be 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), tris (8-hydroxyquinolino)aluminum (Alq3), 4,4',4''-tris (carbazol-9-yl)-triphenylamine (TCTA), 2,2',2''-(1,3,5-benzinetriyl)-tris(1-phenyl-1-H-benzimidazole) (TPBi), and/or the like, but embodiments of the present disclosure are not limited thereto.

The first emission layer 131 may include, as the dopant, PtOEP, Ir(piq)$_3$, Btp2Ir(acac), Ir(piq)$_2$(acac), Ir(2-phq)$_2$ (acac), Ir(2-phq)$_3$, Ir(flq)$_2$(acac), Ir(fliq)$_2$(acac), DCM, DCJTB, tris(dibenzoylmethanato)phenanthoroline europium (PBD:Eu(DBM)$_3$(Phen)), a perylene derivative, and/or the like, but embodiments of the present disclosure are not limited thereto:

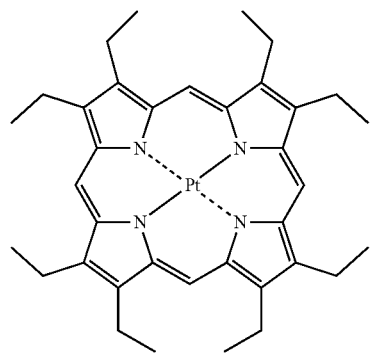

PtOEP

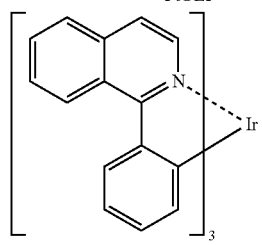

Ir(piq)$_3$

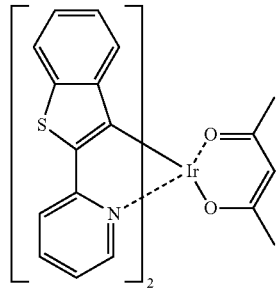

Btp$_2$Ir(acac)

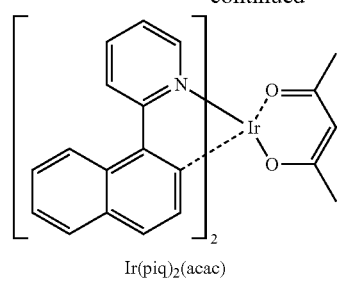

Ir(piq)$_2$(acac)

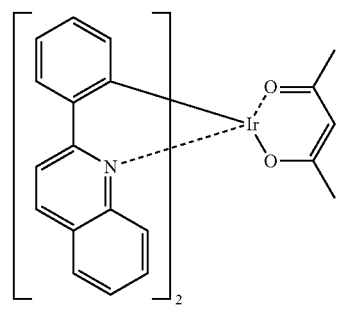

Ir(2-phq)$_2$(acac)

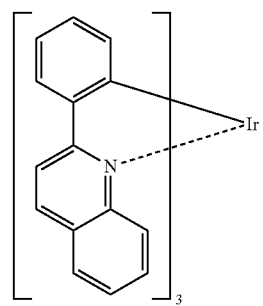

Ir(2-phq)$_3$

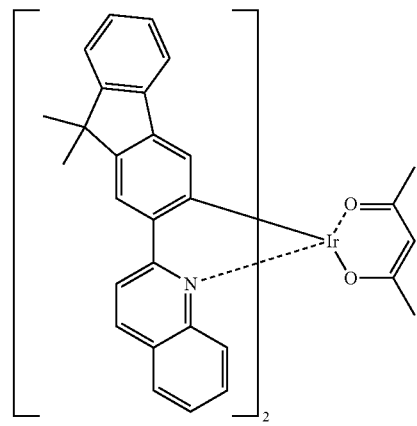

Ir(flq)$_2$(acac)

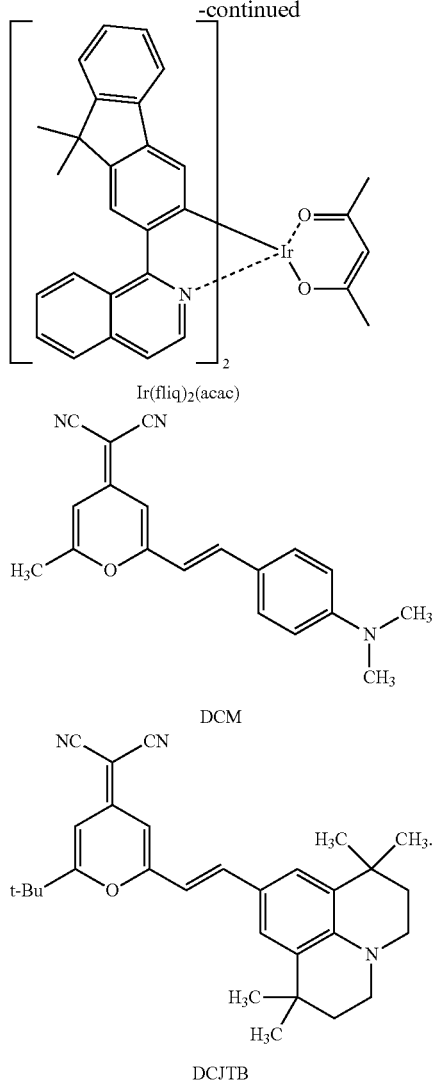

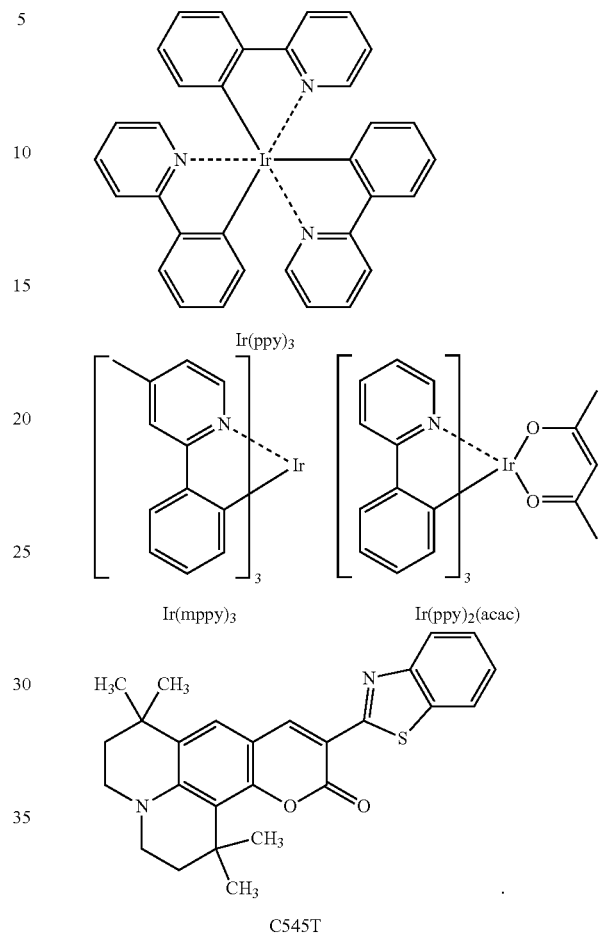

The second emission layer 132 may include, as the dopant, tris(2-phenylpyridine)iridium (Ir(ppy)$_3$), bis(2-phenylpyridine)(acetylacetonato)iridium(III) (Ir(ppy)$_2$(acac)), tris(2-(4-tolyl)phenylpiridine)iridium (Ir(mppy)$_3$), 10-(2-benzothiazolyl)-1,1,7,7-tetramethyl-2,3,6,7-tetrahydro-1H,5H,11H-[1]benzopyrano [6,7,8-ij]-quinolizin-11-one (C545T), and/or the like, but embodiments of the present disclosure are not limited thereto.

Third emission layer 133 may include, as the dopant, 4,6-F$_2$Irpic, (F$_2$ppy)$_2$Ir(tmd), Ir(dfppz)$_3$, ter-fluorene,4,4'-bis(4-diphenylaminostyryl)biphenyl (DPAVBi), spiro-DPVBi, 2,5,8,11-tetra-t-butylperylene (TBPe), distyryl-benzene (DSB), distyryl-arylene (DSA), apolyfluorene (PFO)-based polymer, a poly(p-phenylene vinylene) (PPV)-based polymer, and/or the like, but embodiments of the present disclosure are not limited thereto.

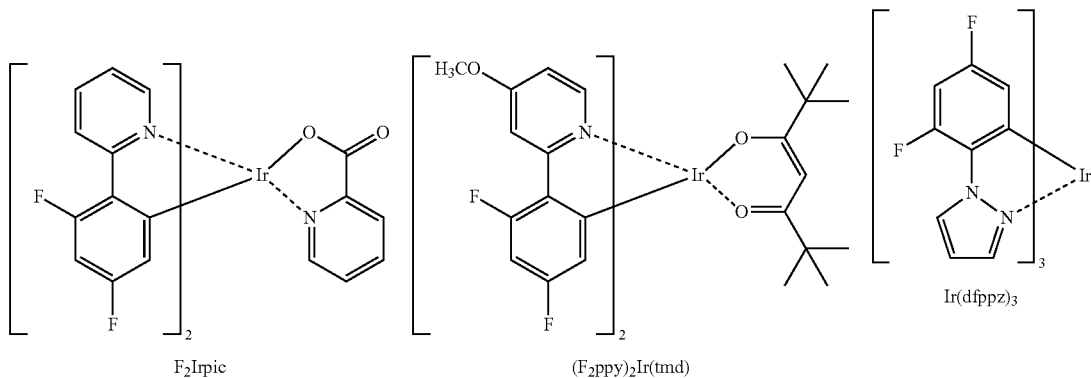

-continued
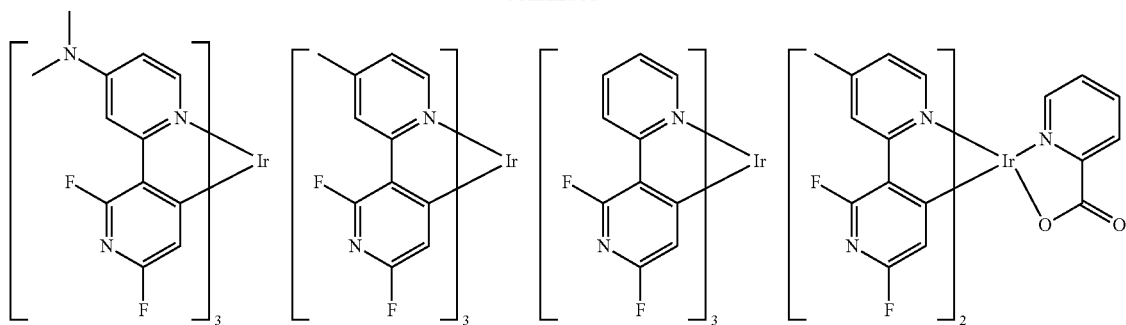
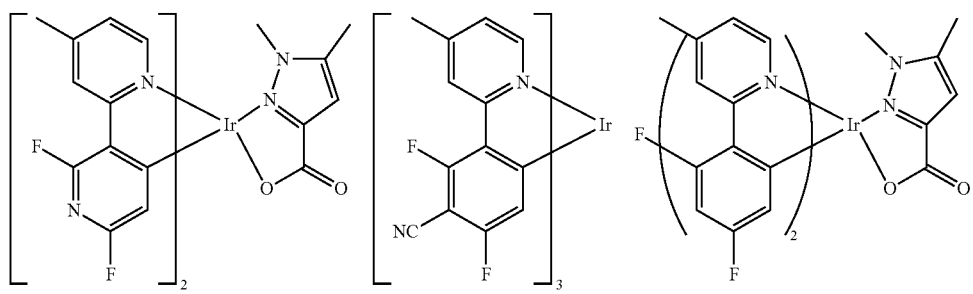
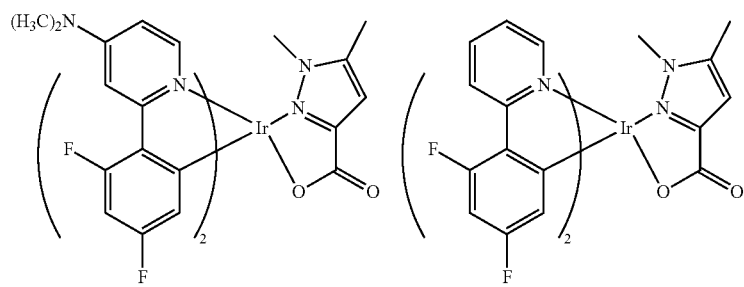
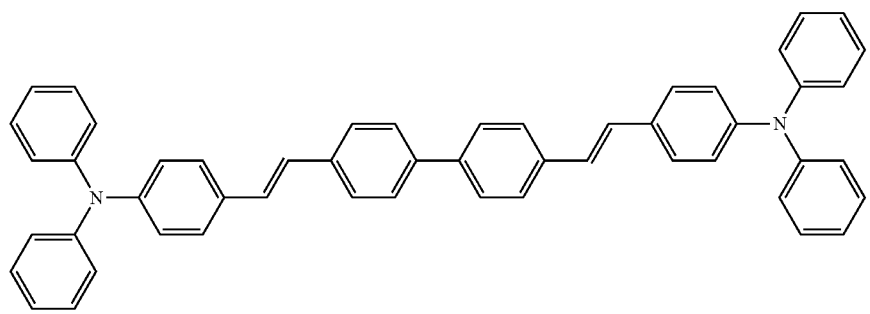
DPAVBi
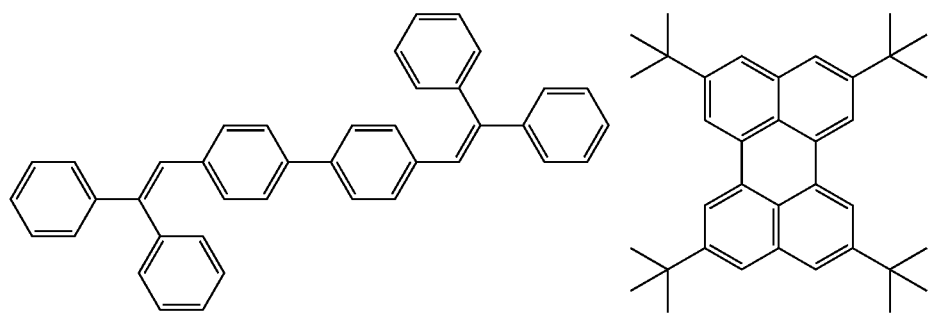
DPVBi
TBPe In some embodiments, the interlayer may further include an electron transport region 140 between the counter electrode 150 and the emission layers 131, 132, and 133.

The electron transport region 140 may have i) a single-layered structure including a single layer including a single material, ii) a single-layered structure including a single layer including a plurality of different materials, or iii) a multi-layered structure having a plurality of layers including a plurality of different materials.

The electron transport region 140 may include at least one layer selected from a buffer layer, a hole blocking layer, an electron control layer, an electron transport layer, and an electron injection layer, but embodiments of the present disclosure are not limited thereto.

For example, the electron transport region 140 may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from an emission layer. However, embodiments of the structure of the electron transport region are not limited thereto.

The electron transport region 140 may include at least one compound selected from 2,9-dimethyl-4,7-diphenyl-1,10-phenanthroline (BCP), 4,7-diphenyl-1,10-phenanthroline (Bphen), Alq$_3$, BAq, 3-(biphenyl-4-yl)-5-(4-tert-butylphenyl)-4-phenyl-4H-1,2,4-triazole (TAZ), and 4-(naphthalen-1-yl)-3,5-diphenyl-4H-1,2,4-triazole (NTAZ):

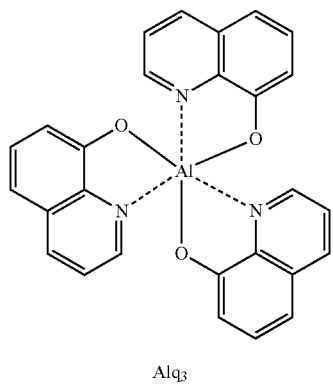

Alq$_3$

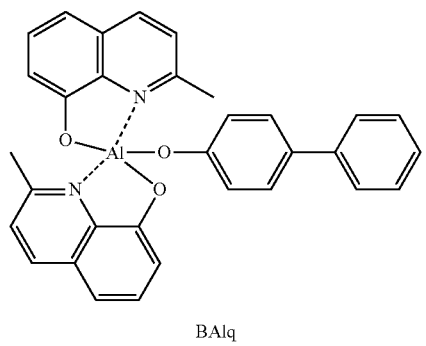

BAlq

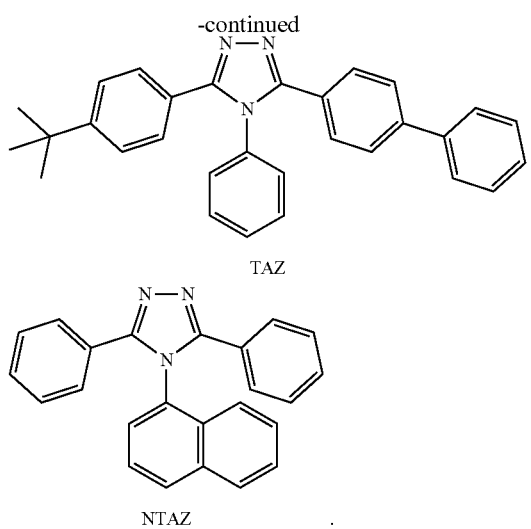

TAZ

NTAZ

Thicknesses of the buffer layer, the hole blocking layer, and the electron control layer may each independently be in a range of about 20 Å to about 1,000 Å, for example, about 30 Å to about 300 Å. When the thickness of the buffer layer, the hole blocking layer, or the electron control layer is within any of the ranges described above, excellent (or suitable) hole blocking characteristics and/or excellent (or suitable) electron control characteristics may be obtained without a substantial increase in driving voltage.

A thickness of the electron transport layer may be in a range of about 100 Å to about 1,000 Å, for example, about 150 Å to about 500 Å. When the thickness of the electron transport layer is within any of the ranges described above, the electron transport layer may have satisfactory (or suitable) electron transport characteristics without a substantial increase in driving voltage.

The electron transport region 140 (for example, the electron transport layer in the electron transport region) may further include, in addition to the materials described above, a metal-containing material.

The metal-containing material may include at least one selected from an alkali metal complex and an alkaline earth-metal complex. The alkali metal complex may include a metal ion selected from a Li ion, a Na ion, a K ion, a Rb ion, and a Cs ion; and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may each independently be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolate, LiQ) and/or Compound ET-D2:

ET-D1

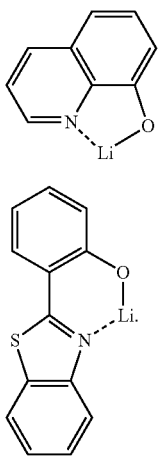

ET-D2

The electron transport region 140 may include an electron injection layer that facilitates electron injection from the counter electrode 150. The electron injection layer may be in direct contact with the counter electrode 150.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth-metal compound, an alkali metal complex, an alkaline earth-metal complex, a rare earth metal complex, or any combination thereof.

The alkali metal may be selected from Li, Na, K, Rb, and Cs. In one embodiment, the alkali metal may be Li, Na, or Cs. In one or more embodiments, the alkali metal may be Li or Cs, but embodiments of the present disclosure are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth-metal compound may each independently be selected from oxides and halides (for example, fluorides, chlorides, bromides, and/or iodides) of the alkali metal, the alkaline earth metal, and the rare earth metal, respectively.

The alkali metal compound may be selected from an alkali metal oxide (such as $Li_2O$, $Cs_2O$, and/or $K_2O$), and an alkali metal halide (such as LiF, NaF, CsF, KF, LiI, NaI, CsI, and/or KI). In one embodiment, the alkali metal compound may be selected from LiF, $Li_2O$, NaF, LiI, NaI, CsI, and KI, but embodiments of the present disclosure are not limited thereto.

The alkaline earth-metal compound may be selected from alkaline earth-metal oxides, such as BaO, SrO, CaO, $Ba_xSr_{1-x}O$ (0<x<1), and/or $Ba_xCa_{1-x}O$ (0<x<1). In one embodiment, the alkaline earth-metal compound may be selected from BaO, SrO, and CaO, but embodiments of the present disclosure are not limited thereto.

The rare earth-metal compound may be selected from $YbF_3$, $ScF_3$, $Sc_2O_3$, $Y_2O_3$, $Ce_2O_3$, $GdF_3$, and $TbF_3$. In one embodiment, the rare earth-metal compound may be selected from $YbF_3$, $ScF_3$, $TbF_3$, $YbI_3$, $ScI_3$, and $TbI_3$, but embodiments of the present disclosure are not limited thereto.

The alkali metal complex, the alkaline earth-metal complex, and the rare earth metal complex may respectively include an ion of alkali metal, alkaline earth-metal, and rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may include (e.g., may consist of) an alkali metal, an alkaline earth metal, a rare earth metal, an alkali metal compound, an alkaline earth-metal compound, a rare earth-metal compound, an alkali metal complex, an alkaline earth-metal complex, a rare earth metal complex, or any combination thereof, as described above. In one or more embodiments, the electron injection layer may further include an organic material. When the electron injection layer further includes an organic material, the alkali metal, the alkaline earth metal, the rare earth metal, the alkali metal compound, the alkaline earth-metal compound, the rare earth-metal compound, the alkali metal complex, the alkaline earth-metal complex, the rare earth metal complex, or any combination thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within any of the ranges described above, satisfactory (or suitable) electron injection characteristics may be obtained without a substantial increase in driving voltage.

Each layer included in the interlayer may be formed in a certain region by using one or more suitable methods selected from vacuum deposition, spin coating, casting, Langmuir-Blodgett (LB) deposition, ink-jet printing, laser printing, and laser-induced thermal imaging (LITI).

When a layer included in the interlayer is formed by vacuum deposition, the deposition may be performed at a deposition temperature of about 100° C. to about 500° C., a vacuum degree of about 10-8 torr to about 10-3 torr, and a deposition speed of about 0.01 Å/sec to about 100 Å/sec, by taking into account a material to be included in a layer to be formed and the structure of a layer to be formed.

When a layer included in the interlayer is formed by spin coating, the spin coating may be performed at a coating speed of about 2,000 rpm to about 5,000 rpm and at a heat treatment temperature of about 80° C. to 200° C., by taking into account a material to be included in a layer to be formed and the structure of a layer to be formed.

Hereinafter, by referring to FIGS. 2B to 2E, the structure of each of the organic light-emitting devices 2, 3, 4, and 5 will be described in more detail, with respect to the differences from FIG. 2A. Like reference numerals in the drawings denote like elements in the above-described embodiments.

Description of FIGS. 2B to 2E

In the organic light-emitting devices 2, 3, 4, and 5 according to one or more embodiments, the second emission layer 132 may be provided over all of the first emission region, the second emission region, and the third emission region.

When the second emission layer 132 is over all of the first emission region, the second emission region, and the third emission region, the number of masks required for the manufacture of the organic light-emitting devices 2, 3, 4, and 5 may be reduced.

In the organic light-emitting device 2, the second emission layer 132 may include a first portion corresponding to the first emission region, a second portion corresponding to the second emission region, and a third portion corresponding to the third emission region, wherein the first portion may be between the first emission layer 131 and the first pixel electrode 111, and the third portion may be between the third emission layer 133 and the third pixel electrode 113.

In the organic light-emitting device 3, the second emission layer 132 may include a first portion corresponding to the first emission region, a second portion corresponding to the second emission region, and a third portion corresponding to the third emission region, wherein the first portion may be between the first emission layer 131 and the counter electrode 150, and the third portion may be between the third emission layer 133 and the counter electrode 150.

In the organic light-emitting device 4, the second emission layer 132 may include a first portion corresponding to the first emission region, a second portion corresponding to the second emission region, and a third portion corresponding to the third emission region, wherein the first portion may be between the first emission layer 131 and the first pixel electrode 111, and the third portion may be between the third emission layer 133 and the counter electrode 150.

In the organic light-emitting device 5, the second emission layer 132 may include a first portion corresponding to the first emission region, a second portion corresponding to the second emission region, and a third portion corresponding to the third emission region, wherein the first portion may be between the first emission layer 131 and the counter electrode 150, and the third portion may be between the third emission layer 133 and the third pixel electrode 113.

Apparatus

The organic light-emitting devices 1, 2, 3, 4, and 5 may be included in various suitable apparatuses.

According to one or more embodiments of the present disclosure, an apparatus includes: a thin-film transistor including a source electrode, a drain electrode, and an activation layer; and the organic light-emitting device 1, 2, 3, 4, or 5, wherein the first pixel electrode 111, the second pixel electrode 112, and the third pixel electrode 113 of the organic light-emitting device 1, 2, 3, 4, or 5 may be electrically connected with one selected from the source electrode and the drain electrode of the thin-film transistor.

The thin-film transistor may further include a gate electrode, a gate insulating layer, and/or the like.

The activation layer may include crystalline silicon, amorphorus silicon, an organic semiconductor, an oxide semiconductor, and/or the like, but embodiments of the present disclosure are not limited thereto.

The apparatus may further include a sealing portion that seals the organic light-emitting device 1, 2, 3, 4, or 5. The sealing portion may enable the implementation of an image from the organic light-emitting device 1, 2, 3, 4, or 5, and may prevent or reduce penetration of outside air and/or moisture into the organic light-emitting device 1, 2, 3, 4, or 5. The sealing portion may be a sealing substrate including a transparent glass substrate and/or a plastic substrate. The sealing portion may be a thin-film encapsulation layer including a plurality of organic layers and/or a plurality of inorganic layers. When the sealing portion is a thin-film encapsulation layer, the apparatus may be entirely flexible.

For example, the apparatus may be a light-emitting apparatus, an authentication apparatus, or an electronic apparatus.

The light-emitting apparatus may be used in various suitable displays, light sources, and/or the like.

The authentication apparatus may be, for example, a biometric authentication apparatus for authenticating an individual by using biometric information of a biometric body (for example, a finger tip, a pupil, and/or the like). The authentication apparatus may further include, in addition to the organic light-emitting device 1, 2, 3, 4, or 5, a biometric information collector.

The electronic apparatus may be applied to personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram (ECG) displays, ultrasonic diagnostic devices, and/or endoscope displays), fish finders, various measuring instruments, meters (for example, meters for a vehicle, an aircraft, and/or a vessel), projectors, and/or the like, but embodiments of the present disclosure are not limited thereto.

General Definition of Substituents

The term "$C_1$-$C_{60}$ alkyl group" as used herein refers to a linear or branched aliphatic saturated hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle and/or at either terminus of the $C_2$-$C_{60}$ alkyl group, and non-limiting examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle and/or at either terminus of the $C_2$-$C_{60}$ alkyl group, and non-limiting examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by -$OA_{101}$ (wherein $A_{101}$ is the $C_1$-$C_{60}$ alkyl group), and non-limiting examples thereof include a methoxy group, an ethoxy group, and an isopropyloxy group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{60}$ heterocycloalkyl group" as used herein refers to a monovalent monocyclic group having at least one heteroatom selected from N, O, Si, P, and S as a ring-forming atom and 1 to 10 carbon atoms as the remaining ring-forming atoms, and non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term $C_3$-$C_{10}$ cycloalkenyl group used herein refers to a monovalent monocyclic group that has 3 to 10 ring-forming carbon atoms, and at least one double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms as the remaining ring-forming atoms, and at least one double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. The term "$C_6$-$C_{60}$ arylene group" used herein refers to a divalent group having the same structure as the $C_6$-$C_{60}$ aryl group. When the $C_6$-$C_{60}$ aryl group and the $C_6$-$C_{60}$ arylene group each independently include two or more rings, the respective two or more rings may be fused to each other.

The term "$C_1$-$C_{60}$ heteroaryl group" as used herein refers to a monovalent group having a heterocyclic aromatic system that has at least one heteroatom selected from N, O, Si, P, and S as a ring-forming atom, in addition to 1 to 60 carbon atoms as the remaining ring-forming atoms. The term "$C_1$-$C_{60}$ heteroarylene group" as used herein refers to a divalent group having the same structure as the $C_1$-$C_{60}$ heteroaryl group. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each independently include two or more rings, the respective two or more rings may be condensed (e.g., fused) with each other.

The term "$C_6$-$C_{60}$ aryloxy group" as used herein refers to a group represented by -$OA_{102}$ (wherein $A_{102}$ is the $C_6$-$C_{60}$ aryl group), and a $C_6$-$C_{60}$ arylthio group used herein refers to a group represented by -$SA_{103}$ (wherein $A_{103}$ is the $C_6$-$C_{60}$ aryl group).

The term "monovalent non-aromatic condensed polycyclic group" as used herein refers to a monovalent group having two or more rings condensed with each other, only carbon atoms as ring-forming atoms (for example, 8 to 60 carbon atoms), and no aromaticity in its entire molecular structure (e.g., the molecular structure as a whole is non-aromatic). A non-limiting example of the monovalent non-aromatic condensed polycyclic group is 9,10-dihydroanthracenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, at least one heteroatom selected from N, O, Si, P, and S, other than carbon atoms (for example, 1 to 60 carbon atoms), as a ring-forming atom, and no aromaticity in its entire molecular structure (e.g., the molecular structure as a whole is non-aromatic). A non-limiting example of the monovalent non-aromatic condensed heteropolycyclic group is a 9,9-dihydroacridinyl group. The term "divalent non-aromatic condensed heteropolycyclic group" as used herein refers to a divalent group having the same structure as the monovalent non-aromatic condensed heteropolycyclic group.

The term "$C_5$-$C_{60}$ carbocyclic group" as used herein refers to a monocyclic or polycyclic group having 5 to 60 carbon atoms in which ring-forming atoms are carbon atoms only. The $C_5$-$C_{60}$ carbocyclic group as used herein refers to an aromatic carbocyclic group or a non-aromatic carbocyclic group. The $C_5$-$C_{60}$ carbocyclic group may be a ring (such as benzene), a monovalent group (such as a phenyl group), or a divalent group (such as a phenylene group). In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having the same structure as the $C_5$-$C_{60}$ carbocyclic group, except that as a ring-forming atom, at least one heteroatom selected from N, O, Si, P, and S is used, in addition to carbon (the number of carbon atoms may be in a range of 1 to 60).

In the present specification, at least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{60}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

The term "Ph" as used herein refers to a phenyl group, the term "Me" as used herein refers to a methyl group, the term "Et" as used herein refers to an ethyl group, the term "ter-Bu" or "Bu$^t$" as used herein refers to a tert-butyl group, the term "OMe" as used herein refers to a methoxy group, and "D" may refer to deuterium.

The term "biphenyl group" as used herein refers to "a phenyl group substituted with a phenyl group". For example, the "biphenyl group" may be described as a substituted phenyl group having a $C_6$-$C_{60}$ aryl group as a substituent.

The term "terphenyl group" as used herein refers to "a phenyl group substituted with a biphenyl group". For example, the "terphenyl group" may be described as a phenyl group having, as a substituent, a $C_6$-$C_{60}$ aryl group substituted with a $C_6$-$C_{60}$ aryl group.

* and *', as used herein, unless defined otherwise, each refer to a binding site to a neighboring atom in a corresponding formula.

Hereinafter, a compound according to embodiments and an organic light-emitting device according to embodiments will be described in more detail with reference to Synthesis Examples and Examples. The wording "B was used instead of A" used in describing Synthesis Examples refers to an identical molar equivalent of B being used in place of A.

EXAMPLES

Example 1

TFT was formed on a glass substrate, a planarization film was formed on TFT by using a polyimide resin, and then, a three-layered structure of ITO/Ag/ITO was patterned thereon as an anode to a thickness of 7 nm/100 nm/7 nm, thereby forming a first pixel electrode, a second pixel electrode, and a third pixel electrode.

Then, Compound HIL-1 was formed to a thickness of 300 Å on the first pixel electrode, the second pixel electrode, and the third pixel electrode, thereby forming a planarization layer (here, a hole injection layer).

Compound HIL-1

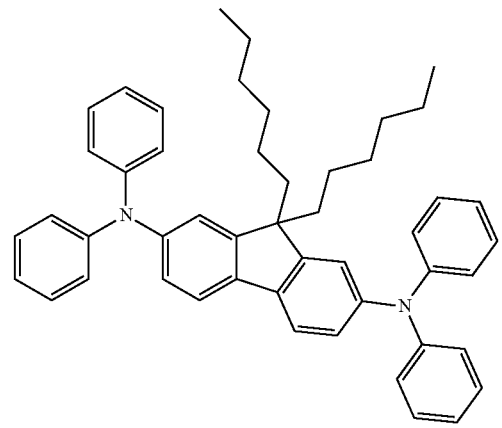

TCTA was deposited to a thickness of 470 Å on the hole injection layer in a region defined by the first pixel electrode, to form a red emission auxiliary layer. Then, on the red emission auxiliary layer, p-TPATHZ, as a host, and Ir(piq)$_3$, as a red dopant, were co-deposited to a thickness of 150 Å at a volume ratio of 100:4, thereby forming a red emission layer.

TPD was deposited to a thickness of 220 Å on the hole injection layer in a region defined by the second pixel electrode, to form a green emission auxiliary layer. Then, on the green emission auxiliary layer, m-CF-PhCz, as a host, and Ir(ppy)$_2$(acac), as a green dopant, were co-deposited to a thickness of 150 Å at a volume ratio of 100:8, thereby forming a green emission layer.

On the hole injection layer in a region defined by the third pixel electrode, mCBP, as a host, and 3-DPADBC, as a blue dopant, were co-deposited to a thickness of 120 Å at a volume ratio of 100:3, thereby forming a blue emission layer.

On the red emission layer, the green emission layer, and the blue emission layer, TPBi was deposited to a thickness of 50 Å to form a buffer layer, and then, PBD and Liq were co-deposited at a ratio of 1:1 on the buffer layer to form an electron transport layer having a thickness of 280 Å. AgMg was then deposited on the electron transport layer to form a counter electrode (here, a cathode) having a thickness of 130 Å, and alpha-NPD was deposited to a thickness of 800 Å on the counter electrode to form a capping layer, thereby completing the manufacture of the organic light-emitting device.

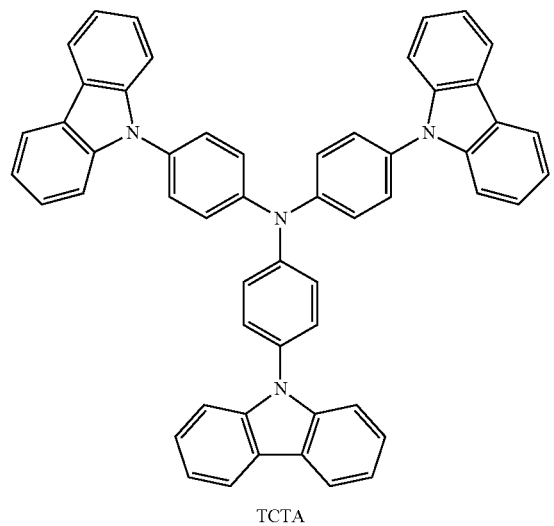

TCTA

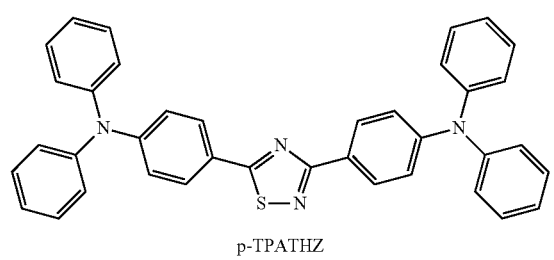

p-TPATHZ

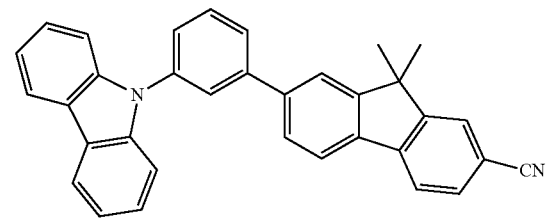

m-CF-PhCz

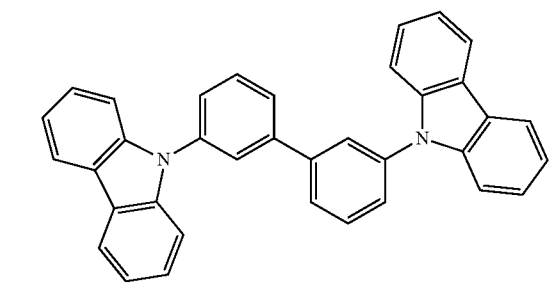

mCBP

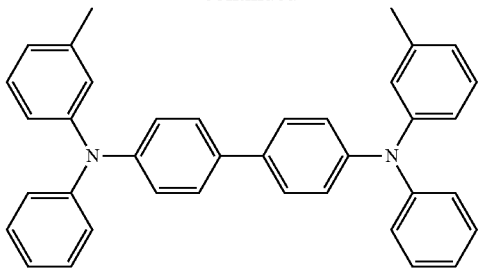

TPD

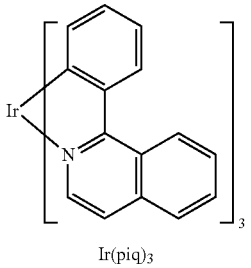

Ir(piq)$_3$

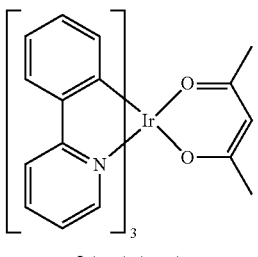

Ir(ppy)$_2$(acac)

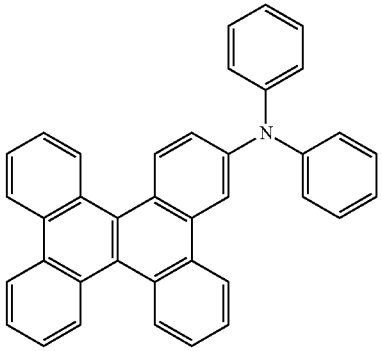

3-DPADBC

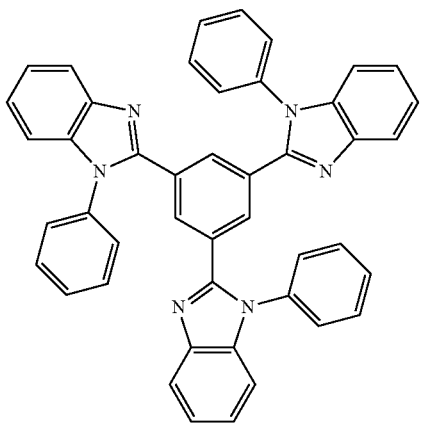

TPBi

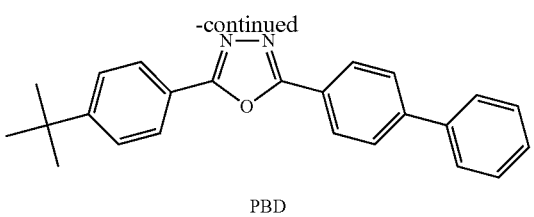

PBD

Comparative Example 1

An organic light-emitting device was manufactured in substantially the same manner as in Example 1, except that TPAC was used instead of Compound HIL-1 in forming a hole injection layer.

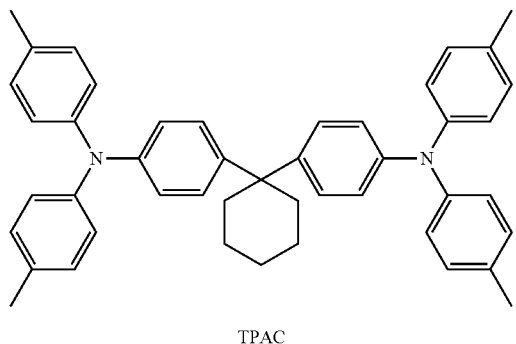 [SMILES: Cc1ccc(N(c2ccc(C)cc2)c2ccc(C3(c4ccc(N(c5ccc(C)cc5)c5ccc(C)cc5)cc4)CCCCC3)cc2)cc1]

TPAC

Evaluation Example

Regarding the organic light-emitting devices manufactured according to Example 1 and Comparative Example 1, the average number of dark spots were observed by auto visual inspection (AVI) and the naked eye, and results thereof are shown in Table 1 below.

TABLE 1

|  | Example 1 | Comparative Example 1 |
|---|---|---|
| Average number of dark spots (spots) | 2.43 | 5.25 |

Referring to Table 1, it was confirmed that the organic light-emitting device of Example 1 showed significantly reduced number of defective dark spots, compared to the organic light-emitting device of Comparative Example 1.

According to the one or more embodiments, the organic light-emitting device may have improved characteristics in terms of defects in dark spots.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims and their equivalents.

What is claimed is:

1. An organic light-emitting device comprising:
a first pixel electrode on a first emission region, a second pixel electrode on a second emission region, and a third pixel electrode on a third emission region;
a counter electrode facing each of the first pixel electrode, the second pixel electrode, and the third pixel electrode; and
an interlayer between the counter electrode and each of the first pixel electrode, the second pixel electrode, and the third pixel electrode,
wherein the interlayer comprises an emission layer, and a hole transport region between the emission layer and each of the first pixel electrode, the second pixel electrode, and the third pixel electrode,
the emission layer comprises:
a first emission layer arranged to correspond to the first emission region and to emit a first color light;
a second emission layer arranged to correspond to the second emission region, or to all of the first emission region, the second emission region, and the third emission region, and to emit a second color light; and
a third emission layer arranged to correspond to the third emission region and to emit a third color light,
wherein each of a maximum emission wavelength of the first color light and a maximum emission wavelength of the second color light is longer than a maximum emission wavelength of the third color light,
the first color light and the second color light are to be emitted as a first order resonance mode, and
the third color light is to be emitted as a first order resonance mode or a second order resonance mode, and
the hole transport region comprises a planarization layer,
wherein the planarization layer comprises an amine-based compound represented by Formula 1, Formula 2A, or Formula 2B, and
the amine-based compound has a crystallization peak having a noise-to-peak ratio of 1.75 or more in an X-ray diffraction (XRD) spectrum:

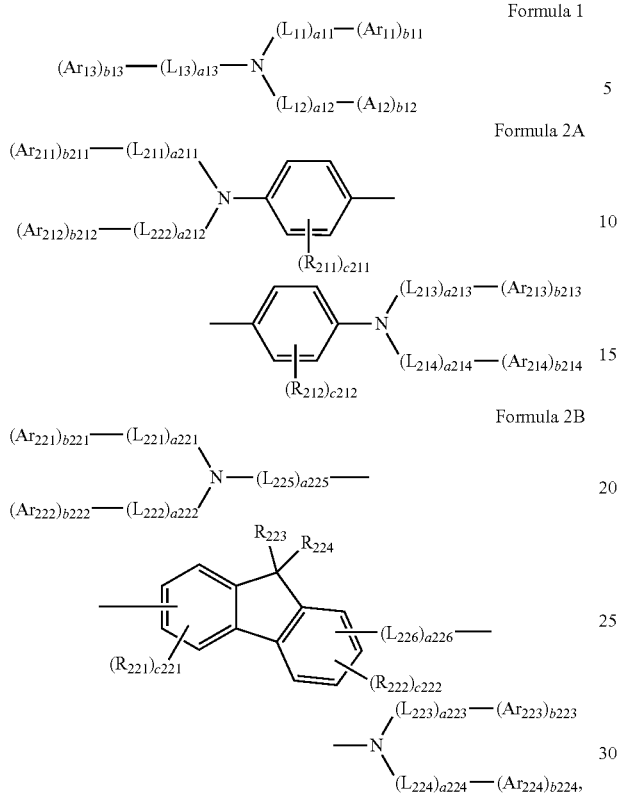

wherein, in Formulae 1, 2A, and 2B,
$L_{11}$ to $L_{13}$, $L_{211}$ to $L_{214}$, and $L_{221}$ to $L_{226}$ are each independently a substituted or unsubstituted $C_5$-$C_{60}$ carbocyclic group or a substituted or unsubstituted $C_1$-$C_{60}$ heterocyclic group, a11 to a13, a211 to a214, and a221 to a226 are each independently an integer from 0 to 3, $Ar_{11}$, $Ar_{12}$, $Ar_{211}$, and $Ar_{213}$ are each independently selected from a substituted or unsubstituted fluorenyl group, a substituted or unsubstituted biphenyl group, and a substituted or unsubstituted naphthyl group, $Ar_{13}$, $Ar_{212}$, and $Ar_{214}$ are each independently selected from a substituted or unsubstituted 9,9'-bifluorenyl group and a substituted or unsubstituted thiophenyl group, $Ar_{221}$ to $Ar_{224}$ are each independently a substituted or unsubstituted $C_5$-$C_{60}$ carbocyclic group or a substituted or unsubstituted $C_1$-$C_{60}$ heterocyclic group, b11 to b13, b211 to b214, and b221 to b224 are each independently an integer from 1 to 3, $R_{211}$, $R_{212}$, $R_{221}$, and $R_{222}$ are each independently selected from hydrogen, deuterium, —F, —Cl, —Br, —I, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —S(=O)$_2$($Q_1$), and —P(=O)($Q_1$)($Q_2$), $R_{223}$ and $R_{224}$ are each independently a substituted or unsubstituted $C_6$-$C_{60}$ alkyl group, c211 and c212 are each independently an integer from 1 to 4, c221 and c222 are each independently an integer from 1 to 3, at least one substituent of the substituted $C_5$-$C_{60}$ carbocyclic group, the substituted $C_1$-$C_{60}$ heterocyclic group, the substituted fluorenyl group, the substituted biphenyl group, the substituted naphthyl group, the substituted 9,9'-bifluorenyl group, the substituted thiophenyl group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amino group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

2. The organic light-emitting device of claim 1, wherein at least one of the first pixel electrode, the second pixel electrode, or the third pixel electrode comprises, on a surface thereof, a plurality of metal particles, and the planarization layer surrounds side surfaces of the plurality of metal particles and at least partially exposes upper regions of the plurality of metal particles, the planarization layer being in direct contact with the first pixel electrode, the second pixel electrode, and the third pixel electrode.

3. The organic light-emitting device of claim 2, wherein the planarization layer comprises:

a first region surrounding side surfaces of the plurality of metal particles and at least partially exposing upper regions of the plurality of metal particles; and a second region horizontally adjacent to the first region, the second region being on surfaces of the first pixel electrode, the second pixel electrode, and the third pixel electrode.

4. The organic light-emitting device of claim 2, wherein the plurality of metal particles comprises silver (Ag) particles.

5. The organic light-emitting device of claim 1, wherein the planarization layer has a thickness in a range of about 250 Å to about 350 Å.

6. The organic light-emitting device of claim 1, wherein, in Formulae 1 and 2A, $Ar_{11}$, $Ar_{12}$, $Ar_{211}$, and $Ar_{213}$ are each independently selected from groups represented by Formulae 3A-1 to 3A-3, and $Ar_{13}$, $Ar_{212}$, and $Ar_{214}$ are each independently selected from groups represented by Formulae 3B-1 and 3B-2:

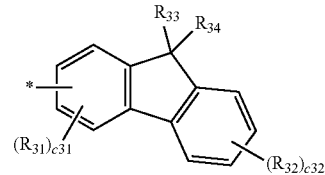

3A-1

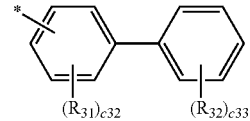

3A-2

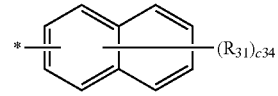

3A-3

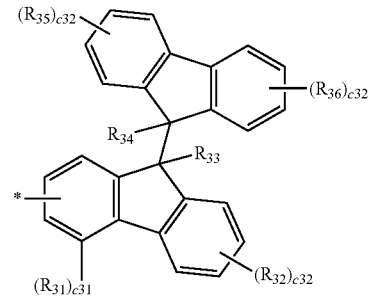

3B-1

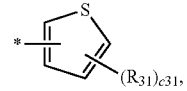

3B-2 wherein, in Formulae 3A-1 to 3A-3, 3B-1, and 3B-2, $R_{31}$ to $R_{36}$ are each independently selected from hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a spiro-fluorene-benzofluorenyl group, a benzofluorenyl group, a dibenzofluorenyl group, a phenalenyl group, a phenanthrenyl group, an anthracenyl group, a fluoranthenyl group, a triphenylenyl group, a pyridinyl group, a pyrazinyl group, a pyrimidinyl group, a quinolinyl group, an isoquinolinyl group, a benzoquinolinyl group, a naphthyridinyl group, a quinoxalinyl group, a quinazolinyl group, a carbazolyl group, a phenanthridinyl group, an acridinyl group, a phenanthrolinyl group, a phenazinyl group, a triazinyl group, a dibenzofuranyl group, a dibenzothiophenyl group, a dibenzosilolyl group, —Si($Q_{31}$)($Q_{32}$)($Q_{33}$), —N($Q_{31}$)($Q_{32}$), and —B($Q_{31}$)($Q_{32}$), c31 is an integer from 1 to 3,
c32 is an integer from 1 to 4,
c33 is an integer from 1 to 5,
c34 is an integer from 1 to 7,
$Q_{31}$ to $Q_{33}$ are each independently selected from hydrogen, deuterium, a $C_1$-$C_{20}$ alkyl group, a $C_1$-$C_{20}$ alkoxy group, a $C_3$-$C_{10}$ cycloalkyl group, a $C_6$-$C_{20}$ aryl group, a $C_6$-$C_{20}$ aryl group substituted with a $C_1$-$C_{20}$ alkyl group, a $C_6$-$C_{20}$ aryl group substituted with a $C_6$-$C_{20}$ aryl group, a $C_1$-$C_{20}$ heteroaryl group, a monovalent non-aromatic condensed polycyclic group, a monovalent non-aromatic condensed heteropolycyclic group, and a terphenylgroup, and \* indicates a binding site to a neighboring atom.

7. The organic light-emitting device of claim 1, wherein the counter electrode comprises a first counter electrode region corresponding to the first emission region, a second counter electrode region corresponding to the second emission region, and a third counter electrode corresponding to the third emission region,
- a first distance ($L_1$) between a surface of the first counter electrode region facing the first pixel electrode and a surface of the first pixel electrode facing the first counter electrode region corresponds to the first order resonance distance of the first color light,
- a second distance ($L_2$) between a surface of the second counter electrode region facing the second pixel electrode and a surface of the second pixel electrode facing the second counter electrode region corresponds to the first order resonance distance of the second color light, and
- a third distance ($L_3$) between a surface of the third counter electrode region facing the third pixel electrode and a surface of the third pixel electrode facing the third counter electrode region corresponds to the first order resonance distance or the second order resonance distance of the third color light.

8. The organic light-emitting device of claim 7, wherein the third color light is to be emitted as a first order resonance mode,
- $L_1$ is in a range of about 1,100 Å to about 1,300 Å,
- $L_2$ is in a range of about 900 Å to about 1,100 Å, and
- $L_3$ is in a range of about 650 Å to about 850 Å.

9. The organic light-emitting device of claim 7, wherein the third color light is to be emitted as a second order resonance mode,
- $L_1$ is in a range of about 1,100 Å to about 1,300 Å,
- $L_2$ is in a range of about 900 Å to about 1,100 Å, and
- $L_3$ is in a range of about 1,700 Å to about 1,900 Å.

10. The organic light-emitting device of claim 1, wherein the first color light is red light, the second color light is green light, and the third color light is blue light.

11. The organic light-emitting device of claim 1, wherein the interlayer further comprises at least one selected from:
- a first resonance control layer between the first pixel electrode and the first emission layer,
- a second resonance control layer between the second pixel electrode and the second emission layer, and
- a third resonance control layer between the third pixel electrode and the third emission layer.

12. The organic light-emitting device of claim 1, wherein the first pixel electrode, the second pixel electrode, and the third pixel electrode are each an anode, and the counter electrode is a cathode,
- the anode is a reflective electrode or a semi-transmissive electrode, and
- the cathode is a transmissive electrode.

13. The organic light-emitting device of claim 1, wherein the first pixel electrode, the second pixel electrode, and the third pixel electrode are each an anode,
- the counter electrode is a cathode,
- the anode is a transmissive electrode, and
- the cathode is a reflective electrode or a semi-transmissive electrode.

14. The organic light-emitting device of claim 1, wherein the second emission layer is arranged to correspond to all of the first emission region, the second emission region, and the third emission region.

15. The organic light-emitting device of claim 14, wherein the second emission layer comprises a first portion corresponding to the first emission region, a second portion corresponding to the second emission region, and a third portion corresponding to the third emission region,
- the first portion is between the first emission layer and the first pixel electrode, and
- the third portion is between the third emission layer and the third pixel electrode.

16. The organic light-emitting device of claim 14, wherein the second emission layer comprises a first portion corresponding to the first emission region, a second portion corresponding to the second emission region, and a third portion corresponding to the third emission region,
- the first portion is between the first emission layer and the counter electrode, and
- the third portion is between the third emission layer and the counter electrode.

17. The organic light-emitting device of claim 14, wherein the second emission layer comprises a first portion corresponding to the first emission region, a second portion corresponding to the second emission region, and a third portion corresponding to the third emission region,
- the first portion is between the first emission layer and the first pixel electrode, and
- the third portion is between the third emission layer and the counter electrode.

18. The organic light-emitting device of claim 14, wherein the second emission layer comprises a first portion corresponding to the first emission region, a second portion corresponding to the second emission region, and a third portion corresponding to the third emission region,
- the first portion is between the first emission layer and the counter electrode, and
- the third portion is between the third emission layer and the third pixel electrode.

19. The organic light-emitting device of claim 1, wherein the interlayer further comprises an electron transport region between the emission layer and the counter electrode.

20. An apparatus comprising:
- a thin-film transistor comprising a source electrode, a drain electrode, and an activation layer; and
- the organic light-emitting device of claim 1,
- wherein the first pixel electrode, the second pixel electrode, and the third pixel electrode of the organic light-emitting device are electrically connected to one selected from the source electrode and the drain electrode.

* * * * *

UNITED STATES PATENT AND TRADEMARK OFFICE
CERTIFICATE OF CORRECTION

PATENT NO. : 11,569,470 B2
APPLICATION NO. : 16/928544
DATED : January 31, 2023
INVENTOR(S) : Hyomin Ko et al.

Page 1 of 2

It is certified that error appears in the above-identified patent and that said Letters Patent is hereby corrected as shown below:

In the Claims

Column 45, Lines 1-7, Claim 1, Formula 1:

Delete "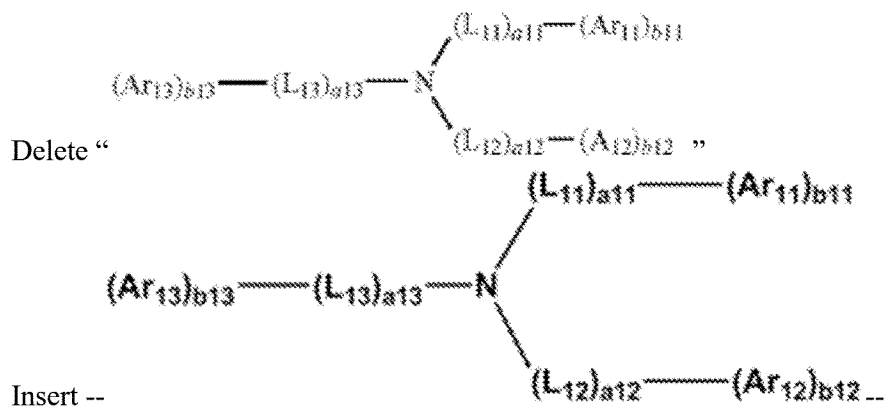"

Insert --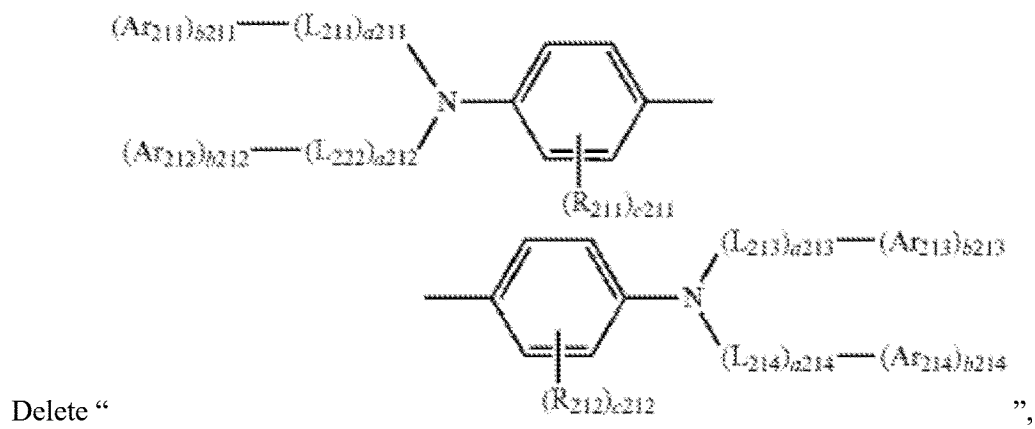--

Column 45, Lines 8-11, Claim 1, Formula 2A:

Delete " ",

Signed and Sealed this
Thirteenth Day of June, 2023

Katherine Kelly Vidal
*Director of the United States Patent and Trademark Office*

CERTIFICATE OF CORRECTION (continued)
U.S. Pat. No. 11,569,470 B2

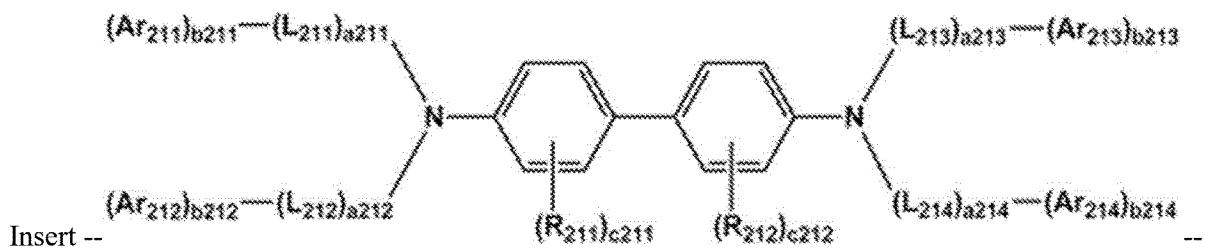

Insert -- --

Column 47, Line 16, Claim 1:
Delete "Si($Q_{31}$)($Q_{32}$)($Q_{33}$),"
Insert -- —Si($Q_{31}$)($Q_{32}$)($Q_{33}$),--

Column 48, Lines 10-16, Claim 6, Formula 3A-2:

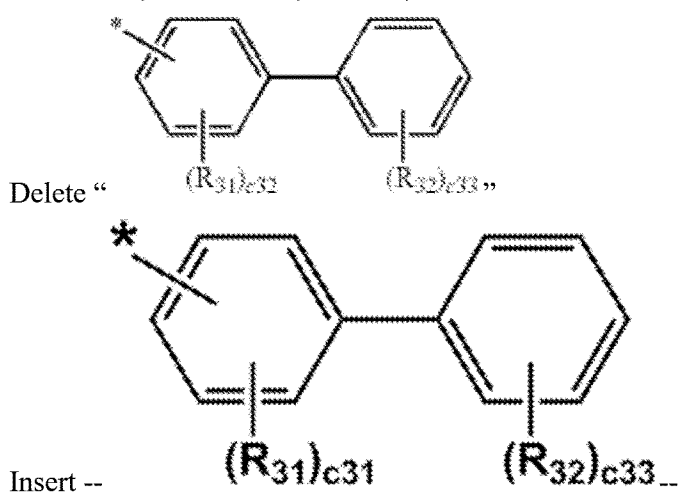

Delete " "

Insert -- --

Column 49, Line 4, Claim 6:
Delete "terphenylgroup,"
Insert --terphenyl group,--